United States Patent
Chevallier et al.

(10) Patent No.: US 7,095,644 B2
(45) Date of Patent: *Aug. 22, 2006

(54) CONDUCTIVE MEMORY ARRAY HAVING PAGE MODE AND BURST MODE READ CAPABILITY

(75) Inventors: Christophe Chevallier, Palo Alto, CA (US); Darrell Rinerson, Cupertino, CA (US)

(73) Assignee: Unity Semiconductor Corporation

( * ) Notice: Subject to any disclaimer, the term of this patent is extended or adjusted under 35 U.S.C. 154(b) by 194 days.

This patent is subject to a terminal disclaimer.

(21) Appl. No.: 10/745,264

(22) Filed: Dec. 22, 2003

(65) Prior Publication Data

US 2005/0135148 A1    Jun. 23, 2005

(51) Int. Cl.
*G11C 11/00*    (2006.01)
(52) U.S. Cl. ............... 365/148; 365/207; 365/158
(58) Field of Classification Search ............... None
See application file for complete search history.

(56) References Cited

U.S. PATENT DOCUMENTS

| | | | |
|---|---|---|---|
| 5,023,844 A | 6/1991 | Arnold et al. | |
| 5,293,350 A | 3/1994 | Kim et al. | |
| 6,108,243 A | 8/2000 | Suzuki et al. | |
| 6,256,247 B1 * | 7/2001 | Perner | 365/209 |
| 6,487,106 B1 | 11/2002 | Kozicki | |
| 6,633,509 B1 | 10/2003 | Scheuerlein et al. | |
| 6,687,147 B1 * | 2/2004 | Fricke et al. | 365/63 |
| 6,711,045 B1 * | 3/2004 | Fricke et al. | 365/63 |
| 6,807,088 B1 * | 10/2004 | Tsuchida | 365/158 |
| 6,839,269 B1 * | 1/2005 | Iwata et al. | 365/158 |
| 6,927,430 B1 | 8/2005 | Hsu | |
| 2002/0186593 A1 | 12/2002 | Takano et al. | |
| 2003/0132456 A1 | 7/2003 | Miyai et al. | |
| 2003/0146776 A1 | 8/2003 | Nakase | |
| 2004/0141369 A1 * | 7/2004 | Noguchi | 365/158 |
| 2004/0257852 A1 | 12/2004 | Yamamura | |
| 2005/0135147 A1 * | 6/2005 | Rinerson et al. | 365/158 |

OTHER PUBLICATIONS

Gerstner et al., "Nonvolatile memory effects in nitrogen doped tetrahedral amorphous carbon thin films", 1998, Journal of Applied Physics, vol. 84, No. 10, pp. 5647-5651.
Simmons et al., "New conduction and reversible memory phenomena in thin insulating films", 1967, Proc. Roy. Soc. A., vol. 301, pp. 77-102.
U.S. Appl. No. 10/745,178, filed Dec. 22, 2003, Rinderson et al.
Office Action Mailed Sep. 12, 2005 for U.S. Appl. No. 10/745,178 ; Pham, Ly D ; Art Unit 2827.
Office Action Mailed Mar. 20, 2006 for U.S. Appl. No. 10/745,178 ; Pham, Ly D ; Art Unit 2827.
Applicants Response to Office Action Mailed Sep. 12, 2005 for U.S. Appl. No. 10/745,178 ; Pham, Ly D ; Art Unit 2827.
Applicants Response to Office Action Mailed Mar. 20, 2006 for U.S. Appl. No. 10/745,178 ; Pham, Ly D ; Art Unit 2827.

* cited by examiner

*Primary Examiner*—David Lam

(57) ABSTRACT

Conductive memory array having page mode and burst mode read capability. The conductive memory array includes two-terminal memory plugs and sensing circuits configured to read information from the memory plugs in two cycles. The array also includes associated circuitry that allows it to carry out such two-cycle reads in either page mode or burst mode.

31 Claims, 20 Drawing Sheets

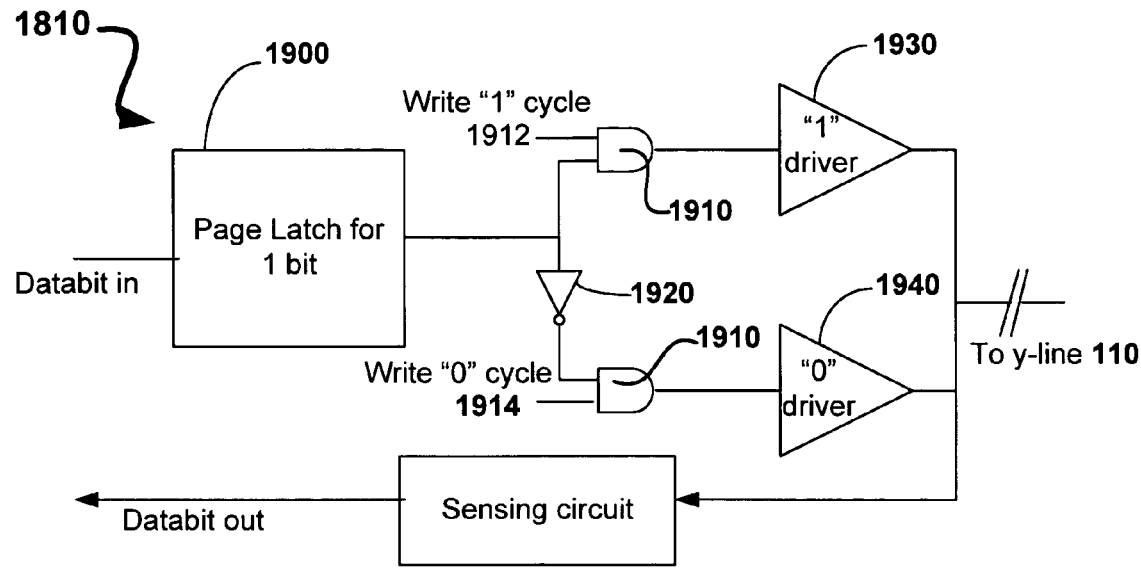
FIG. 19A
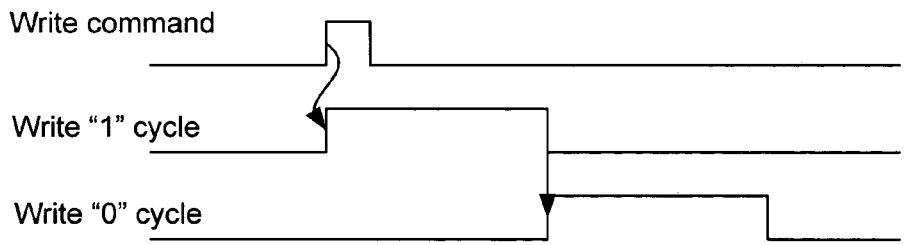
FIG. 19B
| Page latch data | | During Wr. "1" cycle | During Wr. "0" cycle |
|---|---|---|---|
| 1 | Input of "1" driver: | 1 | 0 |
| | Input of "0" driver: | 0 | 0 |
| 0 | Input of "1" driver: | 0 | 0 |
| | Input of "0" driver: | 0 | 1 |
| Where "1" on the driver input signifies that the driver is enabled. | | | |
FIG. 19C

CONDUCTIVE MEMORY ARRAY HAVING PAGE MODE AND BURST MODE READ CAPABILITY

This application is related to the following U.S. Patent Applications: application Ser. No. 10/360,005, filed Feb. 7, 2003, now issued U.S. Pat. No. 6,917,539; application Ser. No. 10/330,153, filed Dec. 26, 2002, now issued U.S. Pat. No. 6,834,008; application Ser. No. 10/387,799, filed Mar. 13, 2003; application Ser. No. 10/387,773, filed Mar. 13, 2003; application Ser. No. 10/249,848, filed May 12, 2003, now issued U.S. Pat. No. 6,856,536; application Ser. No. 10/612,733, filed Jul. 1, 2003; application Ser. No. 10/604,606, filed Aug. 4, 2003; application Ser. No. 10/634,636, filed Aug. 4, 2003; application Ser. No. 10/665,882, filed Sep. 19, 2003; application Ser. No. 10/680,508, filed Oct. 6, 2003, now issued U.S. Pat. No. 6,940,744; application Ser. No. 10/682,277, filed Oct. 8, 2003; and application Ser. No. 10/605,963, filed Nov. 10, 2003, now issued U.S. Pat. No. 7,009,235. All of the above applications are hereby incorporated herein by reference in their entireties and for all purposes.

BRIEF DESCRIPTION OF THE INVENTION

This invention relates generally to computer memory. More specifically, this invention relates to page mode and burst mode.

BACKGROUND OF THE INVENTION

Conventional nonvolatile computer memory requires three terminal MOSFET-based devices. The layout of such devices is not ideal, usually requiring an area of at least $8f^2$ for each memory cell, where f is the minimum feature size. However, not all memory elements require three terminals. If, for example, a memory element is capable of changing its electrical properties (e.g., resistivity) in response to a voltage pulse, only two terminals are required. With only two terminals, a cross point array layout that allows a single cell to be fabricated to a size of $4f^2$ can be utilized. The performance of cross point arrays utilizing two-terminal memory elements would be further improved if one were able to read and write to multiple elements simultaneously, so as to speed data transfer, especially if such data transfers were accomplished via either page mode or burst mode.

It would therefore be desirable to fabricate a cross point array from two-terminal memory elements. To speed the data transfer process, it would further be desirable to read and write to multiple memory plugs of a cross point array simultaneously, for example by employing page mode and/or burst mode.

SUMMARY OF THE INVENTION

In one embodiment, a re-writable memory includes a substrate and a cross point memory array formed above the substrate. The cross point memory array includes a first conductive array line and second conductive array lines, each of the second conductive array lines oriented generally substantially perpendicular to the first conductive array line, and two-terminal memory plugs. Each memory plug has a first terminal in electrical communication with the first conductive array line and a second terminal in electrical communication with one of the second conductive array lines, and each memory plug is configured to assume a first electrical resistance that corresponds to a first data state in response to a first voltage and a second electrical resistance that corresponds to a second data state in response to a second voltage. The re-writable memory also includes sensing circuits, each sensing circuit in electrical communication with one of the second conductive array lines and an associated one of the memory plugs. Each sensing circuit is further configured to sense an electrical current passing through one of the second conductive array lines, so as to read the first and second data states from the associated one of the memory plugs. The sensing circuits are configured to translate these first and second data states into binary information.

BRIEF DESCRIPTION OF THE DRAWINGS

For a better understanding of the invention, reference should be made to the following detailed description taken in conjunction with the accompanying drawings, in which:

FIG. 19A depicts a page latch circuit for writing information in page mode and burst mode in accordance with an embodiment of the invention;

FIG. 19B depicts write command signals for writing information in page mode and burst mode in accordance with an embodiment of the invention;

FIG. 19C depicts a diagram of write signal input and corresponding output when writing information in page mode and burst mode in accordance with an embodiment of the invention;

Like reference numerals refer to corresponding parts throughout the drawings.

DETAILED DESCRIPTION OF THE INVENTION

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessarily obscuring the present invention.

Various embodiments of the present invention depict a cross point memory array utilizing two-terminal memory elements. As discussed above, such memory elements allow for more compact memory. However, cross point arrays utilizing two terminal memory elements would also possess certain drawbacks. For instance, it is difficult to write different data values to multiple two terminal memory elements simultaneously. One aspect of the invention, therefore, depicts a cross point array having page mode and burst mode, which allows for improved data transfer.

Figure 1:
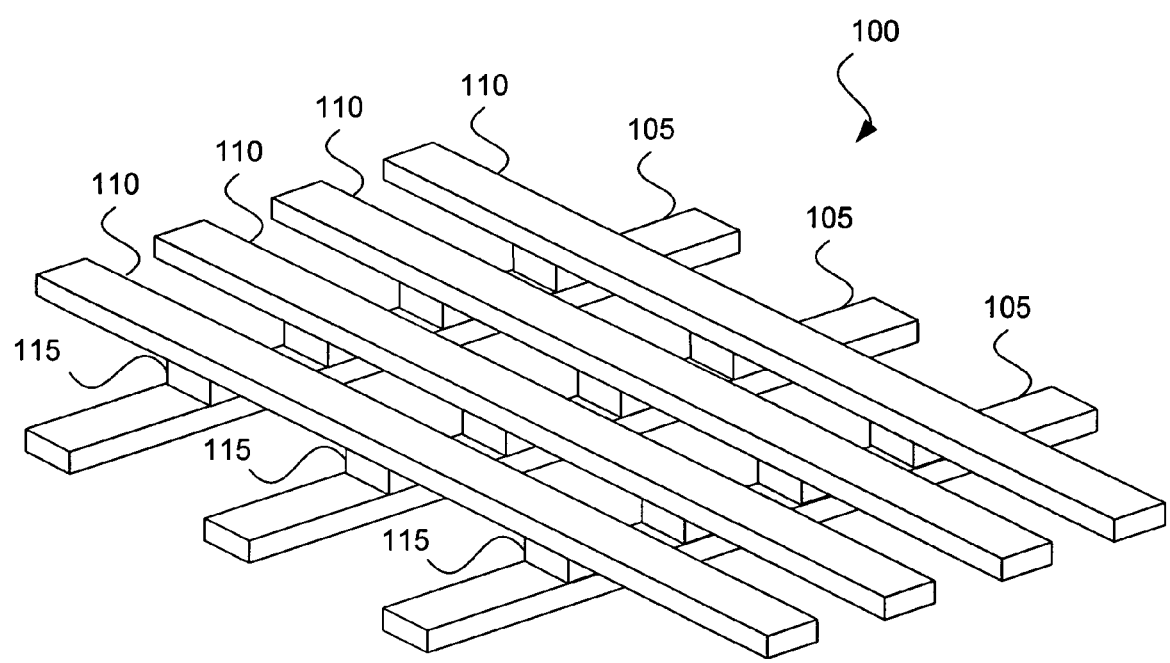
FIG. 1 depicts a perspective view of an exemplary cross point memory array employing a single layer of memory.

FIG. 1 depicts an exemplary cross point array 100 employing a single layer of memory. A bottom layer of x-direction conductive array lines 105 is orthogonal to a top layer of y-direction conductive array lines 110. The x-direction conductive array lines 105 act as a first terminal and the y-direction conductive array lines 110 act as a second terminal to a plurality of two-terminal memory plugs 115, which are located at the intersections of the conductive array lines 105 and 110. The conductive array lines 105 and 110 are used to collectively deliver voltage pulses to the memory plugs 115 in order to program resistive states and carry current through the memory plugs 115 in order to determine their resistive states.

Data is written to a specific memory plug by applying a voltage to its corresponding x-direction line and y-direction line, a sufficient voltage acting to set the memory plug to a particular resistive state. This resistive state indicates the type of data stored. For instance, in FIG. 1, each of the memory plugs 115 can be fabricated so as to switch to a high resistive state upon application of +4V, and a low resistive state upon application of −4V. In this manner, applying +2V to the far left x-direction line and −2V to the far left y-direction line would switch the far left memory plug to a high resistive state, writing, say, a binary 1. Conversely, applying −2V to the far left x-direction line and +2V to the far left y-direction line would switch the far left memory plug to a low resistive state, thus writing a binary 0. In order to read the data stored in the memory plug, the x-direction line could then apply a reference voltage to the memory plug, whereupon sensing circuitry connected to the y-direction lines 110 would detect either a high or low current and register either a binary 0 or 1.

It is often desired, however, to write blocks of data to more than one memory plug at a time. For example, the four memory plugs attached to the far left x-direction line may represent part of a word. In a cross point array where a memory plug is selected by applying a voltage across 2 perpendicular lines, so that only the memory plug at the intersection of the 2 lines is selected, and where the memory plug state can be altered by applying a voltage of a certain magnitude and reversibly altered to an opposite logic state by applying a voltage of different polarity, it is not possible to select and write to 2 memory plugs with opposite data. For example, if a binary 1 is to be written to the far left memory plug, the x-direction line must be set to +2V, and the y-direction line to −2V. But this makes writing a binary 0 to any of the other memory plugs of the word difficult, as they all share the same x-direction line. A voltage of +6V would have to be applied to the appropriate y-direction line in order to apply 4V across the memory plug, which would change the resistance of all other memory plugs along that y-direction line since they would experience a 6V drop, assuming the other x-direction lines were held to ground. Fortunately, the read process does not suffer from the same drawbacks as the write process. One can read from multiple y-direction lines 110 simultaneously by applying a voltage to a single x-direction line and reading the current flowing through the y-line of each corresponding memory plug. Thus, for instance, a voltage can be applied to the far left x-direction line of FIG. 1, and the current flowing through each y-direction line 110 can then be simultaneously measured to determine the binary information stored within each memory plug connected to the x-direction line.

One resolution of the above problem is to use separate arrays. By controlling separately the lines in 8 arrays, it is possible to write simultaneously random data to 8 arrays. Such separate arrays can be referred to as "bit blocks", since each array handles a single bit out of the data bus width (the data bus width defines the length of a word). So, for example, a memory integrated circuit of 256 Mbit of density, with 8 data I/Os could have 8 bit blocks of 32 Mbit each. Such a memory is described in FIG. 16, where 1610 represents a bit block.

The inability to easily write to simultaneous memory plugs 115 within the same cross point array 100 also makes it difficult to implement other known techniques for reading from and writing information to the memory. For instance, the ability to implement page mode and burst mode in a cross point array 100 having two terminal memory plugs 115 would greatly speed both the write process and the read process.

There are two common techniques used to output or input data in the page, often termed "page mode" and "burst mode." In both cases these modes take advantage of the memory internal architecture. Words that are consecutive in address can be accessed faster with such modes, as the X/Y selection is only performed once, and the data for a number of words, which constitute a "page", is read or written at once, as opposed to being read or written one word at a time. This number of consecutive words read together and commonly referred as a "page" is also referred here as "the information set".

In page mode, the lower significant bits of the address bus can be utilized to determine the order in which individual bits are to be read or written. The words selected by these address bit combinations can thus be in any order, and some words may not be read of written.

In burst mode, an external clock is used to sequentially input or output the words in the page. The internal read or write operation is similar to page mode. A post-sensing decoding block can be configured to simply sequentially output its information upon receipt of a trigger signal from an external burst clock. In this manner, information is either read from the decoding block or written to the cross point array automatically upon receiving the trigger signal. The advantage of burst mode over page mode is that no address decoding is needed to input or output the subsequent words in the page; this technique thus allows for a faster access time. The disadvantage of burst mode over page mode is that the page words can only be accessed in a set order.

In an embodiment of the invention, the page or burst read would be accomplished by selecting multiple y-lines, connecting them to sensing circuits, and connecting the sensing circuit outputs to a post-sensing decoding block to select the appropriate data to bring to the pins of the memory integrated circuit. The page or burst write would be accomplished by selecting multiple y-lines, connecting them to the same number of drivers and energizing the drivers in a two-cycle sequence that writes in parallel all bits of the same data polarity (e.g., all binary 1's during the first cycle, and all binary 0's during the second). A pre-driver decoding stage would ensure that the data coming from the memory integrated circuit data pins is loaded in the appropriate latches, as will be detailed below.

Referring back to FIG. 1, conductive array line layers 105 and 110 can generally be constructed of any conductive material, such as aluminum, copper, tungsten or certain ceramics. Depending upon the material, a conductive array line would typically cross between 64 and 8192 perpendicular conductive array lines. Fabrication techniques, feature size and resistivity of material may allow for shorter or longer lines. Although the x-direction and y-direction conductive array lines can be of equal lengths (forming a square cross point array) they can also be of unequal lengths (forming a rectangular cross point array).

Figure 2:
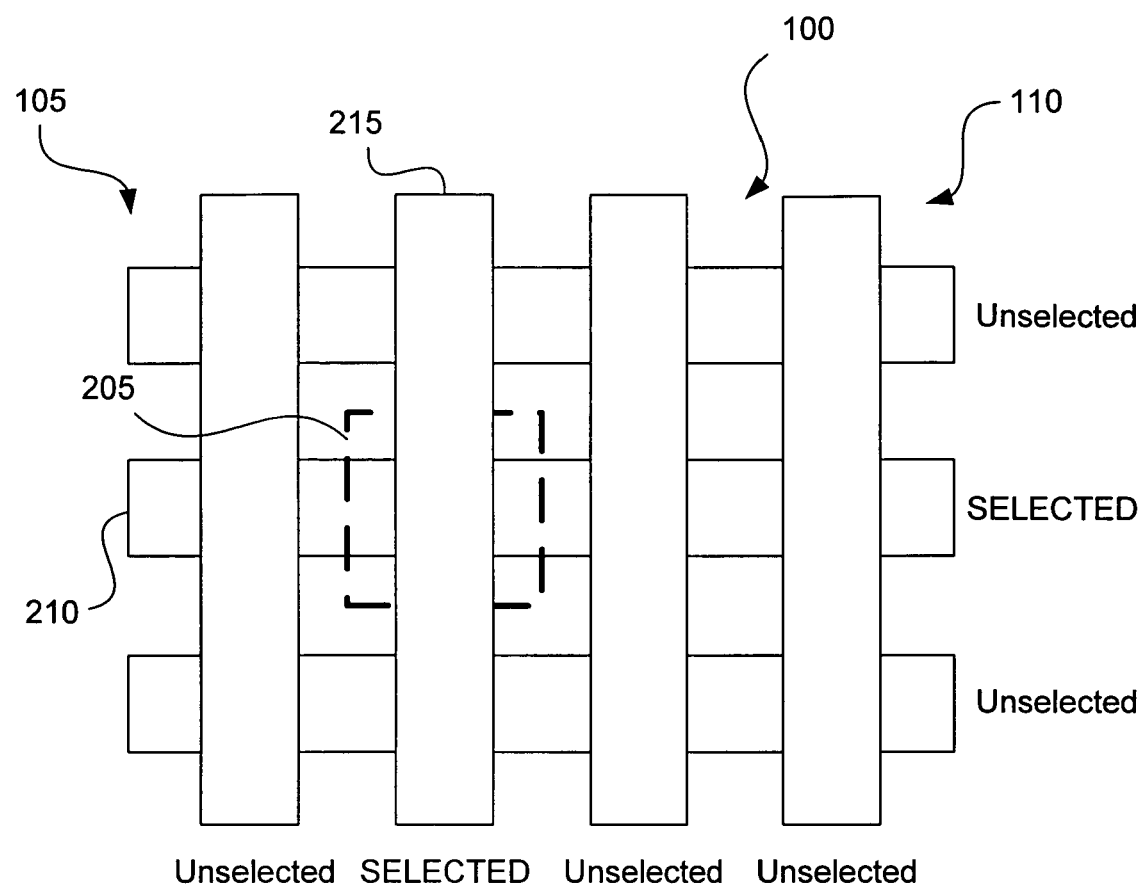
FIG. 2 depicts a plan view of selection of a memory cell in the cross point array depicted in FIG. 1.
Figure 3:
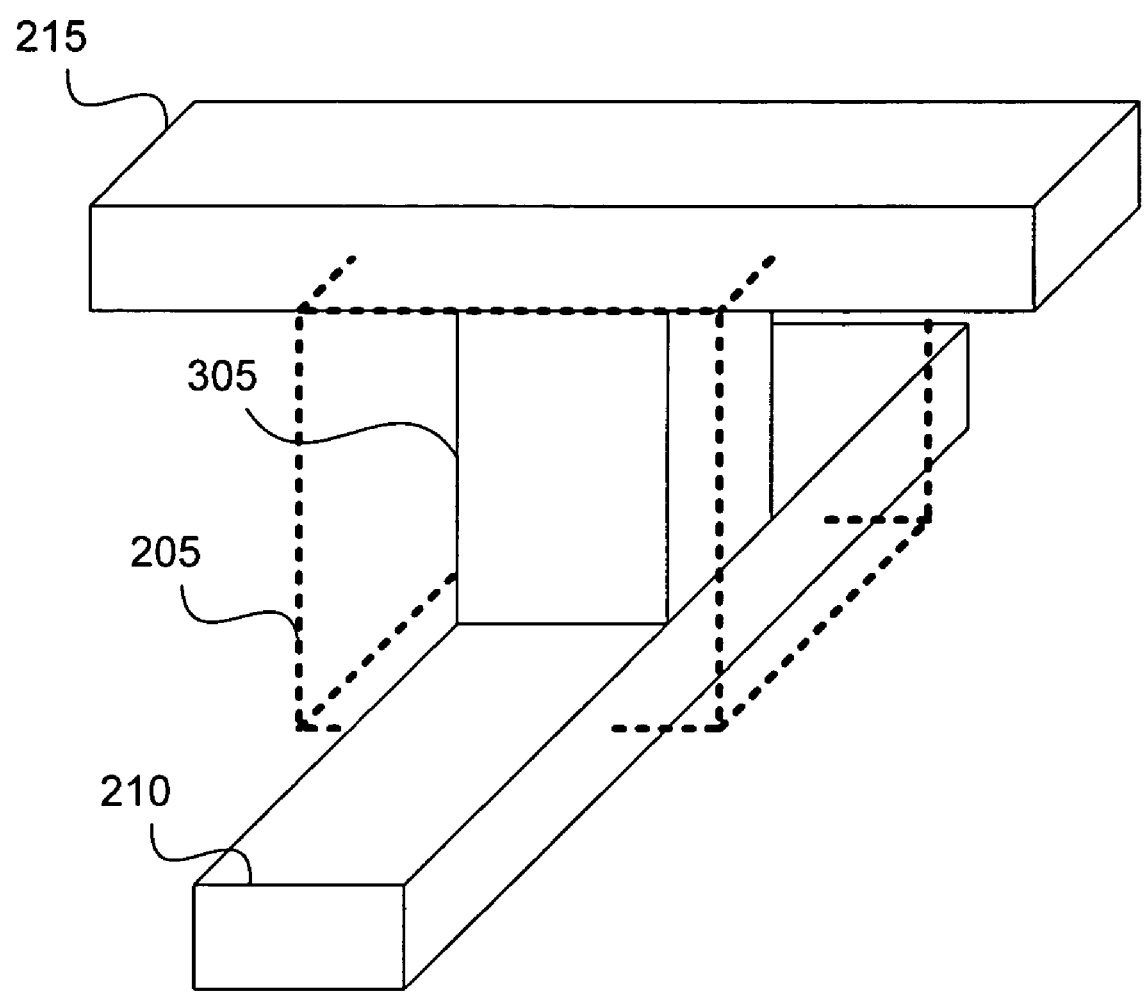
FIG. 3 depicts a perspective view of the boundaries of the selected memory cell depicted in FIG. 2.

FIG. 2 illustrates selection of a memory cell 205 in the cross point array 100. The point of intersection between a single x-direction conductive array line 210 and a single y-direction conductive array line 215 uniquely identifies the single memory cell 205. FIG. 3 illustrates the boundaries of the selected memory cell 205. The memory cell is a repeatable unit that can be theoretically extended in one, two or even three dimensions. One method of repeating the memory cells in the z-direction (orthogonal to the x-y plane) is to use both the bottom and top surfaces of conductive array lines 105 and 110.

Figure 4:
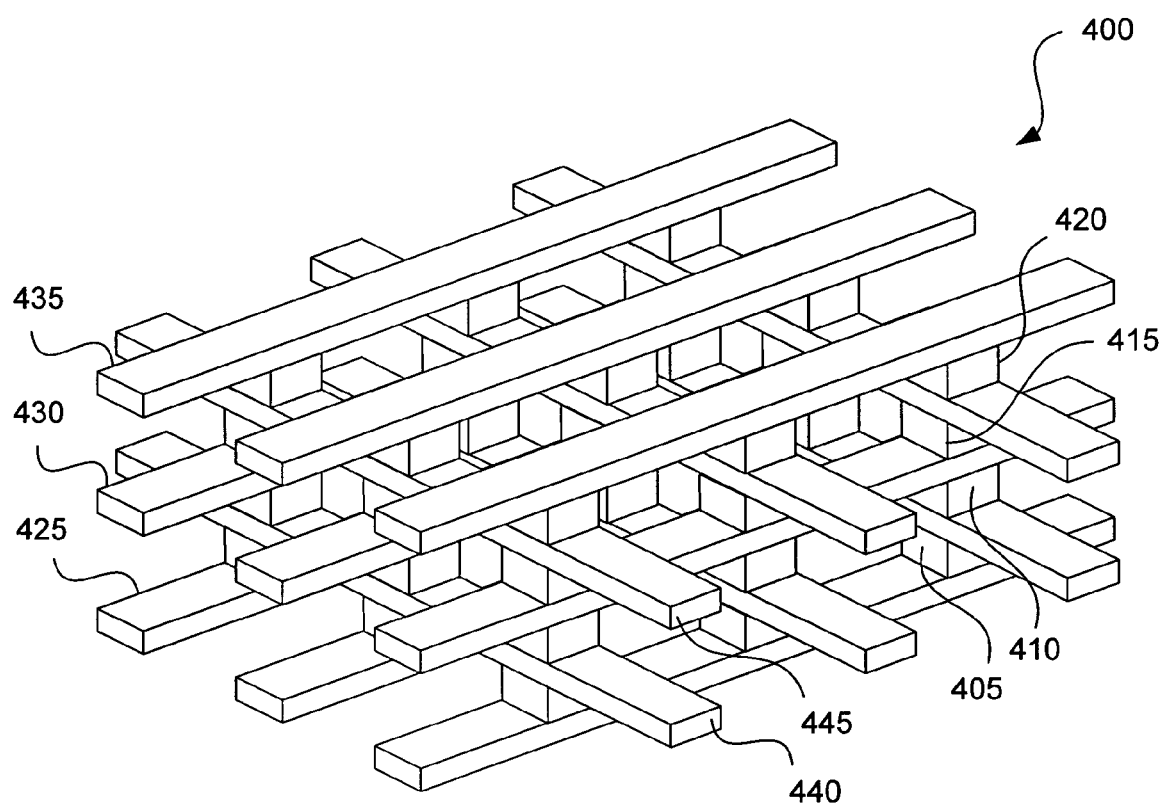
FIG. 4 depicts a perspective view of an exemplary stacked cross point memory array employing four layer of memory.

FIG. 4 depicts an exemplary stacked cross point array 400 employing four memory layers 405, 410, 415, and 420. The memory layers are sandwiched between alternating layers of x-direction conductive array lines 425, 430 and 435 and y-direction conductive array lines 440 and 445 such that each memory layer 405, 410, 415, and 420 is associated with only one x-direction conductive array line layer and one y-direction conductive array line layer. Although the top conductive array line layers 435 and bottom conductive array line layer 425 are only used to supply voltage to a single memory layer 405 and 420, the other conductive array line layers 430, 440, and 445 can be used to supply voltage to both a top and a bottom memory layer 405, 410, 415, or 420.

Referring back to FIG. 2, the repeatable cell that makes up the cross point array 100 can be considered to be a memory plug, plus ½ of the space around the memory plug, plus ½ of an x-direction conductive array line and ½ of a y-direction conductive array line. Of course, ½ of a conductive array line is merely a theoretical construct, since a conductive array line would generally be fabricated to the same width, regardless of whether one or both surfaces of the conductive array line was used. Accordingly, the very top and very bottom layers of conductive array lines (which use only one surface) would typically be fabricated to the same size as all other layers of conductive array lines.

Generally, one benefit of the cross point array is that the active circuitry that drives the cross point array 100 or 400 can be placed beneath the cross point array, therefore reducing the footprint required on a semiconductor substrate. Co-pending U.S. Patent application, "Layout Of Driver Sets In A Cross Point Memory Array," U.S. application Ser. No. 10/612,733, filed Jul. 1, 2003, already incorporated by reference, describes various circuitry that can achieve a small footprint underneath both a single layer cross point array 100 and a stacked cross point array 400.

Figure 5:
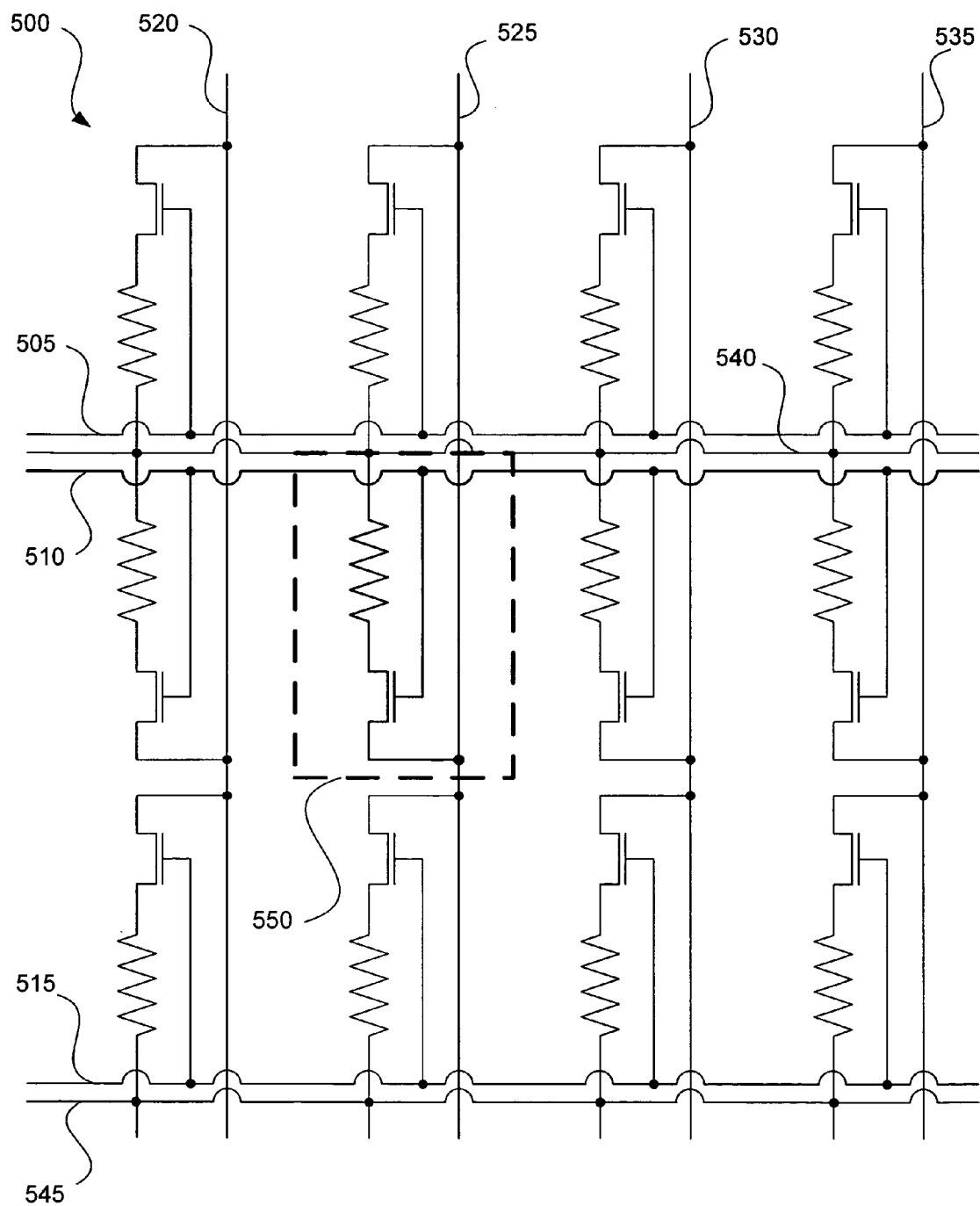
FIG. 5 depicts a schematic diagram of selection of a memory cell in a transistor memory array.

The cross point array is not the only type of memory array that can be used with a two-terminal memory element. FIG. 5 is a schematic representation of an array 500 of memory cells laid out in a two-dimensional transistor memory array 500. Each memory cell in the transistor memory array 500 is connected to one select line 505, 510, or 515, one data line 520, 525, 530, or 535, and a reference line 540 or 545. In one embodiment, all reference lines 540 and 545 are held to the same voltage, and perhaps even tied together. Therefore, a single select line 510 and a single data line 525 uniquely define an individual memory cell 550.

By connecting the select lines 505, 510, and 515 to the gates of field effect transistors (FETs), the select lines 505, 510, and 515 can control whether current from the data lines 520, 525, 530, and 535 are able to pass to the memory plugs. The data lines 520, 525, 530, and 535 both carry the data from the memory cells during read operations and provides the memory cells with a voltage pulse appropriate to change the resistive state of the memory plug during write operations. Selection circuitry used to select a specific data line 520, 525, 530, or 535 would generally be placed outside the select transistor memory array 500.

Figure 6:
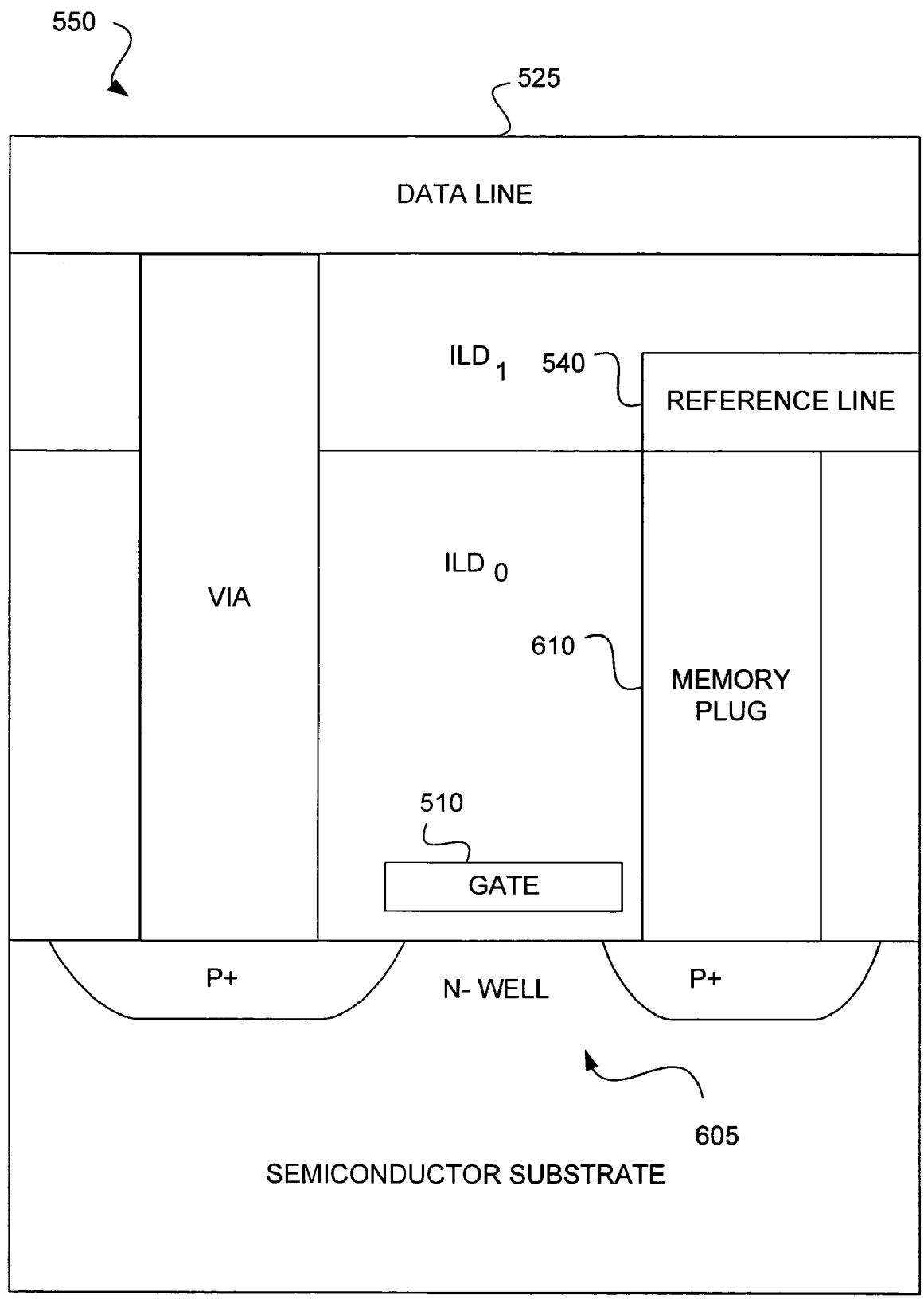
FIG. 6 depicts a cross section of the selected memory cell depicted in FIG. 5.

FIG. 6 is a diagrammatic representation of the memory cell 550 that can be used in a transistor memory array 500. Each memory cell 550 includes a transistor 605 and a memory plug 610. The transistor 605 is used to permit current from the data line 525 to access the memory plug 610 when an appropriate voltage is applied to the select line 510, which is also the transistor's gate. The reference line 540 might span two cells if the adjacent cells are laid out as the mirror images of each other. Co-pending U.S. Patent application, "Non-Volatile Memory with a Single Transistor and Resistive Memory Element," U.S. application Ser. No. 10/249,848, filed May 12, 2003, already incorporated by reference, describes the specific details of designing and fabricating a select transistor memory array.

The Memory Plug

Each memory plug 305 or 610 contains a memory element along with any other materials that may be desirable for fabrication or functionality. For example, the additional materials might include electrodes and a non-ohmic device, as is described in co-pending application "High Density NVRAM," U.S. application Ser. No. 10/360,005, filed Feb. 7, 2003, already incorporated by reference. The non-ohmic device exhibits a very high resistance regime for a certain range of voltages (VNO− to VNO+) and a very low resistance regime for voltages above and below that range. Together, the memory element and the non-ohmic device cause the memory plug 305 or 610 to exhibit a non-linear resistive characteristic. While a non-ohmic device might be desirable in certain arrays, it may not be helpful in other arrays.

Figure 7:
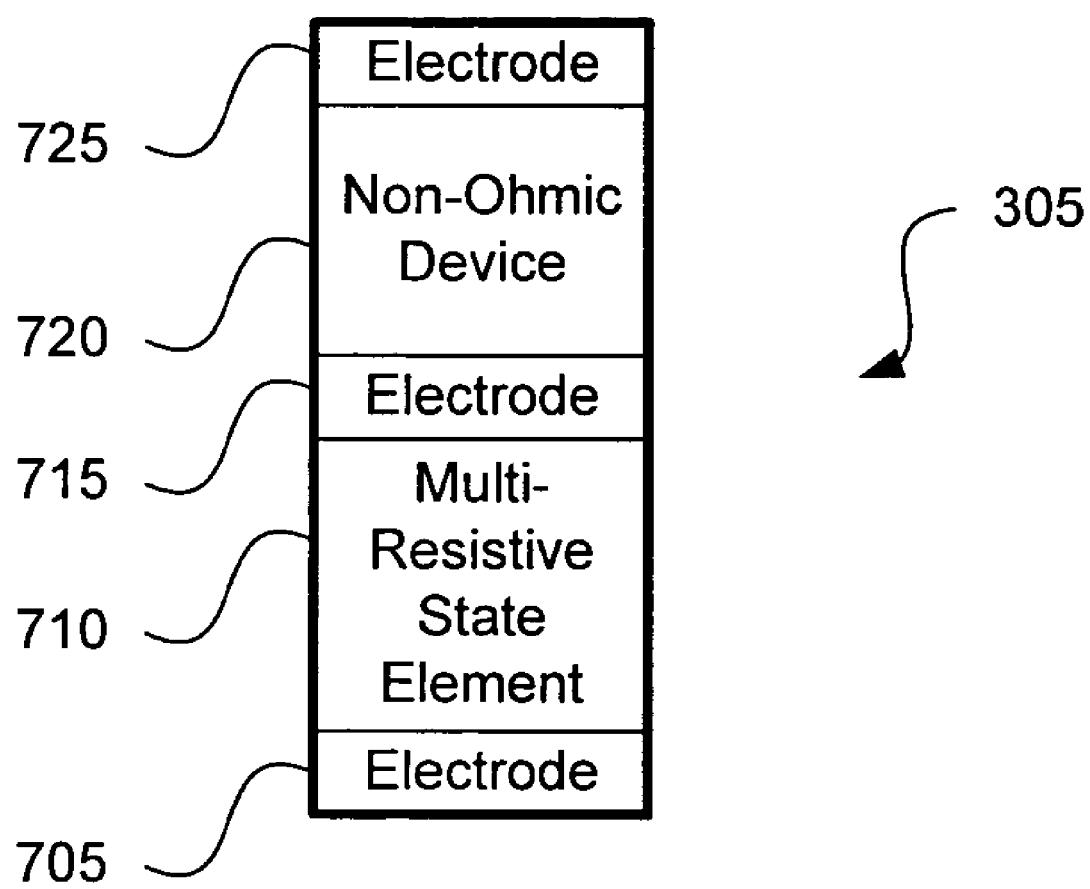
FIG. 7 depicts an elevation view of an exemplary memory plug with five layers.

FIG. 7 depicts a side view of an exemplary five-layer memory plug 305 with a non-ohmic device. The five layers are: a first electrode layer 705, a layer of a multi-resistive state element 710, a second electrode layer 715, a layer making up the non-ohmic device 720, and a third electrode 725. Some layers may actually be made up of multiple thin films. For example, one type of non-ohmic device 720 uses a three film metal-insulator-metal (MIM) structure. Additionally, certain multi-resistive state elements use multiple thin films. Furthermore, not all the layers are required for every memory plug 305 or 610 configuration. For example, certain cross point arrays may use means other than the non-ohmic device 720 to prevent unselected memory plugs from being disturbed.

The Electrodes

The fabrication techniques used for the memory plug 305 or 610 will typically dictate the requirements of the layers beneath the memory plug (e.g., the select lines 505, 510, and 515 in the transistor memory array 500). Certain fabrication processes (e.g., solution based spin on followed by high temperature anneal, pulsed laser deposition, sputtering, and metalorganic chemical vapor deposition) might require high temperature. Therefore refractory metals should be used for these layers so that they may withstand the high temperature fabrication process. However, refractive metals have higher resistances, which may limit the number of cells on an array.

Typical electrodes 705, 715 and 725 commonly used in fabrication include Pt, Au, Ag and Al. If the only purpose of the electrodes 705, 715 and 725 is as a barrier to prevent metal inter-diffusion, then a thin layer of metal, e.g. TiN, could be used. However, conductive oxide electrodes may provide advantages beyond simply acting as a metal inter-diffusion barrier.

For example, a conductive oxide electrode might modify the formation and migration of oxygen vacancies in the memory material. Oxygen vacancies can cause degradation of electrical properties in the multi-resistive state element 710. A conductive oxide electrode can also withstand high temperature processing. Most metals either start oxidizing or combining with adjacent materials at temperatures above 400 C. Accordingly, fabrication processes above these temperatures can be considered to be high temperature processing. Additionally, conductive oxide electrodes will not degrade during operation. Regular metal electrodes may degrade due to the electric field and interaction between the metal atoms and the memory material atoms.

Examples of conductive oxides include LaSrCoO3, RuO2, IrO2, SrRuO3, LaNiO3 and doped strontium titanate (STO). The dopant used in STO can be either Nb or Ta to substitute for titanium atoms, or any rare earth such as La or Pr to substitute for strontium atoms. Generally, a conductive oxide electrode is metallic with resistivity below 1 Ω-cm.

Conductive oxide electrodes can be fabricated directly, or can be made with a material that is not initially an oxide, but is subsequently oxidized during further processing or operation. Ru and Ir are both examples of materials that can be oxidized during processing or operation.

Additionally, certain materials oxidize at a finite rate and allow dual layers to form. For example, Ir might be particularly well suited for making contact to an underlying conductive array line layer 105. When Ir is oxidized, the top of the Ir layer becomes IrO2. Since the IrO2 grows at a finite rate it becomes possible to control the oxidation so that a dual layer of Ir/IrO2 is formed. Such a dual layer could provide a good contact on the un-oxidized bottom while still forming an oxygen barrier on the oxidized top.

Furthermore, some conductive oxides electrodes form a good lattice match with the multi-resistive state element 710, and thus lower crystallization temperature for the resistive material. For example, if the multi-resistive state element 710 is STO, possible conductive oxide electrodes that make a good lattice match include doped STO, LaSrCoO3, and SrRuO3. If the multi-resistive state element 710 is PCMO, possible conductive oxide electrodes include the STO electrodes and also LaNiO3. A seed layer will often be used on top of the thin layer of metal. A seed layer will help the formation of the layer grown or deposited above it. For example, the seed layer could be on Pt, Ru, Ir or TiN. Some seed layer/metal layer matches include LaNiO3 or SrRuO3 on Pt, IrO2 on Ir, RuO2 on Ru, and Pt on TiN.

Another benefit to certain conductive oxide electrodes is that stress may be reduced by more closely matching the conductive oxide electrode's coefficient of thermal expansion to the multi-resistive state element 710.

The electrodes 705, 715 and 725 might be further improved by using a layer of metal such as platinum between the multi-resistive state element layer 710 and the conductive oxide electrode. Such implementations advantageously provide a good barrier with the conductive oxide, and a good contact with an adjacent metal layer.

Barrier layers are generally helpful to prevent inter-diffusion of atoms after different materials have been deposited. For example, barrier layers can block the diffusion of metals, oxygen, hydrogen or water. Binary oxides or nitrides with 2 elements and ternary oxides or nitrides with 3 elements are particularly suited to high temperature processing. Unlike a regular electrode like titanium that oxidizes and becomes non-conductive, titanium nitride will not oxidize and will remain conductive until about 500 C. Ternary nitrides oxidize at even higher temperatures, typically about 50 C higher than binary nitrides. The rate of oxidation depends on the temperature and the oxygen partial pressure.

Examples of binary nitrides include titanium nitride, tantalum nitride and tungsten nitride. Examples of ternary nitrides include titanium silicon nitride, tantalum aluminum nitride, tantalum silicon nitride, and ruthenium titanium nitride. An example of a ternary oxide is ruthenium tantalum oxide.

As will be appreciated by those skilled in the art, an electrode may require other layers, in order to properly function. For example adhesion layers are sometimes necessary. An adhesion layer is used between a substrate and thin-film layer to improve adhesion of the thin-film layer to substrate. Pt does not stick well to SiO2, so a glue layer, such as Ti or TiO2, is used between them for better adhesion. Similarly, a sacrificial barrier layer is an oxide layer that is deposited for the sole purpose of capturing all the oxygen that could otherwise diffuse into other layers, such as the multi-resistive state element 710. The electrode 705 is considered to consist of everything in between x-direction conductive array line 210 and the multi-resistive state element 710, including any adhesion or sacrificial barrier layers, as required. Similarly, the electrode 715 consists of all layers between the multi-resistive state element 710 and the non-ohmic device 720 and the electrode 725 consists of everything in between the non-ohmic device 720 and the y-direction conductive array line 215.

For example, an electrode may includes a TiN or TiAlN layer, an Ir layer and an IrO2 layer to have good metal barrier and oxygen barrier properties. However, such additional layers are only necessary to the extent they are required. Certain conductive oxide electrodes may provide multiple functions. For example, ternary nitrides and ternary oxides that have one component that is either ruthenium or iridium and another component that is either tantalum or titanium can act as both a barrier layer and a sacrificial high-temperature oxygen barrier.

It will be appreciated that the choice of electrode layers 705, 715 and 725 in combination with the multi-resistive state element layer 710 may affect the properties of the memory plug 305 or 610.

Memory Plug Operation

The various properties of the multi-resistive state element 710 will determine both the lowest possible resistance state and the highest possible resistive state. Although the highest operational resistive state (R0) of the memory plug 305 or 610 does not need to be its highest theoretical state and the lowest operational resistance state (R1) does not need to be its lowest theoretical state, designs can set R0 and R1 close to those states for simplicity.

When considering an operating value of the R1 resistive state, parasitic resistances that are in series with the memory plug must also be considered. Sources of resistance include the contacts and the vias, the metal interconnect lines, and the driver circuits. Parasitic resistances might total 100–200Ω, which puts a lower limit on the memory plug resistance. While the parasitic resistance may be overcome through more complicated circuit design, such designs typically result in loss of access time, or a larger die size.

The R1 state of the memory plug may have an optimal value of 10 kΩ to 100 kΩ. If the R1 state resistance is much less than 10 Ω, the current consumption will be increased because the cell current is high, and the parasitic resistances will have a larger effect. If the R1 state value is much above 100 kΩ, the RC delays will increase access time. However, workable single state resistive values may still be achieved with resistances as low as 5 kΩ and as high as 1 MΩ. Typically, a single state memory would have the operational voltages of R0 and R1 separated by a factor of 10.

For example, if 1 volt were used as a read voltage (VR), R1 might be about 100 kΩ and R0 might be about 1 MΩ, making the current either 10 μA or 1 μA, depending on the resistive state. Since large currents can be destructive to semiconductors fabricated to small dimensions, no more than 10 μA would be desired for a memory circuit in most cases. Once a VR is identified, a desired write voltage (VW) can also be determined. Not only should VW be greater than VR, but it should also be far enough away from VR to allow minor voltage fluctuations (e.g., due to fabrication imperfections) to have a negligible effect on the multi-resistive state element 710. Similarly, VW should be greater than VWth, the threshold at which the resistive material starts to change resistivity, for the same reason. A typical VW might be about 2 volts, and VWth might be about 1.5 volts.

It should be noted that changes in the resistive property of the memory plugs that are greater than a factor of 10 might be desirable in multi-bit resistive memory cells that have more than two states. Generally, adjusting the pulse width and magnitude of the voltage pulses across the multi-resistive state element results in different resistive states. Since multi-resistive state element 710 can be placed into several different resistive states, multi-bit resistive memory cells are possible. For example, the multi-resistive state element might have a high resistive state of R00, a medium-high resistive state of R01, a medium-low resistive state of R10 and a low resistive state of R11. Since multi-bit memories typically have access times longer than single-bit memories, using a factor greater than a 10 times change in resistance from R11 to R00 is one way to make a multi-bit memory as fast as a single-bit memory. For example, a memory cell that is capable of storing two bits might have the low resistive state be separated from the high resistive state by a factor of 100. A memory cell that is capable of storing three or four bits of information might require the low resistive state be separated from the high resistive state by a factor of 1000. Typically, the intermediary resistive states in a multi-bit memory would evenly subdivide the resistive range between the high resistive state and the low resistive state on a logarithmic scale. For example, if a memory cell that held three bits of memory had a low resistive state of 10 kΩ, the six intermediary states might have resistive states of about 26.8 kΩ, 72.0 kΩ, 193 kΩ, 518 kΩ, 1.39 MΩ, and 3.73 MΩ. The highest resistive state would then be 10 MΩ, 1000 times the value of the low resistive state. Each optimal resistive state could be calculated by using the relationship Log (R110)=Log (R111)+Log K; Log (R101)=Log (R111)+2 Log K; Log (R100)=Log (R111)+3 Log K; . . . Log (R000)=Log (R111) +7 Log K, where Log K=(⅐)[Log (R000)−Log (R111)].

Ideally, the multi-resistive state element 710 should switch very quickly from one resistive state to another. Typically, anything less than 50 nanoseconds would be an appropriate switching speed for applications such as mobile phones, PDAs or other portable electronics devices. Additionally, once the multi-resistive state element 710 is placed in a resistive state, it should be able to retain that state for long periods of time. Ideally, the material should retain its resistive state for over ten years. Since the read voltage should not affect the resistive state, repeated application of the read voltage over ten years should not change the resistive state of the multi-resistive state element 710.

The Multi-Resistive State Element

Figure 8A:
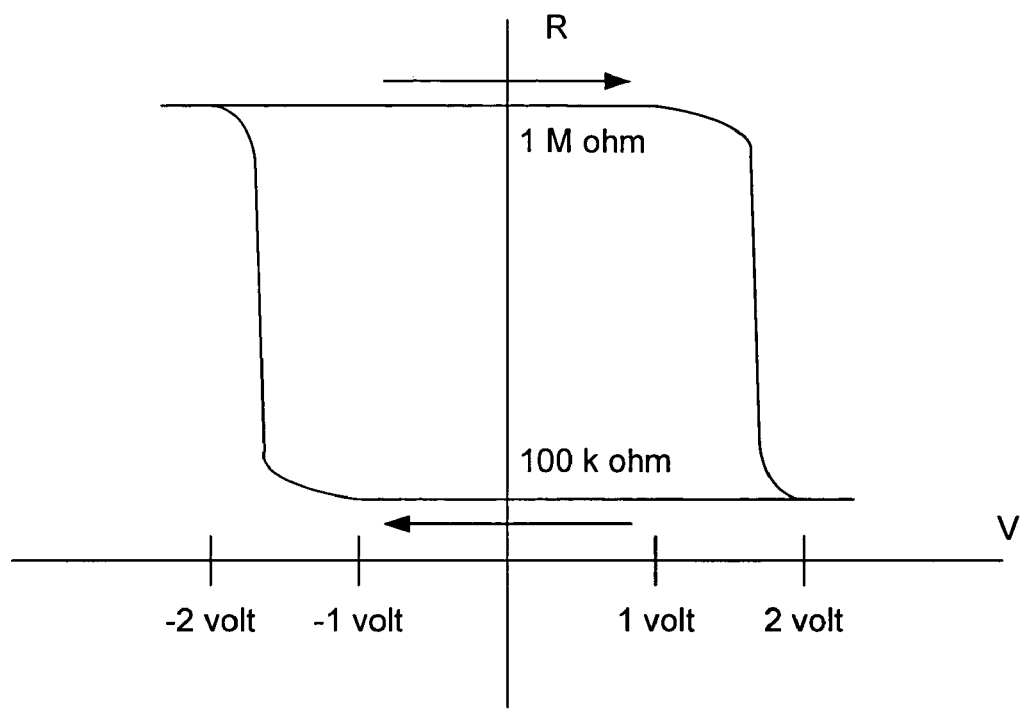
FIG. 8A depicts a graph illustrating exemplary RV characteristics of a memory element initially biased in one direction.

Importantly, the multi-resistive state element 710 should have a hysteresis that allows non-destructive reads. As shown in FIG. 8A any voltages between −VR (depicted as −1 volt) and +VR (depicted as 1 volt) will have no effect on the resistive state of the memory element (i.e., it will remain at either 100 kΩ or 1 MΩ). Therefore, a write operation is not necessary after a read operation for such materials.

The hysteresis shown in FIG. 8A has two write threshold voltages, one for when the multi-resistive state element 710 is in the low resistive state R1 and one for when the multi-resistive state element 710 is in the high resistive state R0. In the low resistive state R1, the first write threshold voltage −VWth is the point above which any voltages applied across the multi-resistive state element 710 have substantially no effect on the resistive state of the multi-resistive state element 710 and below which a voltage pulse will alter the resistance of the multi-resistive state element 710. Similarly, in the high resistive state R0, the second write threshold voltage +VWth is the point below which any voltages applied across the multi-resistive state element 710 have substantially no effect on the resistive state of the multi-resistive state element 710 and above which a voltage pulse will alter the resistance of the multi-resistive state element 710.

When initially fabricated, the multi-resistive state element 710 may be in a high resistive state R0. The multi-resistive state element 710 then transitions from its high resistive state R0 to a low resistive state R1 in response to a voltage pulse. Whether the bottom terminal is at +3V and the top terminal is at −3V in order to lower the resistive sate or vice-versa depends upon the specific properties of the material that is used. FIG. 8A is an example of the multi-resistive state element 710 that grequires a +2V pulse to lower its resistive state and FIG. 8B, a mirror image of FIG. 8A, is an example of the multi-resistive state element 710 that requires a −2V pulse to lower its resistive state.

Generally, the chemical and materials properties of the multi-resistive state element 710 are selected to meet the electrical specifications set forth above. For example, the material preferably has a resistivity of between about 0.1Ω-cm to 1Ω-cm (although workable values may be as high as 5Ω-cm and the multi-resistive state element may be able to achieve a much lower resistivity), exhibits a change in resistance of at least about 10x, and has this resistance change triggered by the application of a voltage pulse of not longer than about 100 ns duration and not greater than about 10V in magnitude.

The multi-resistive state element 710 will generally, but not necessarily, be crystalline, either as a single crystalline structure or a polycrystalline structure. One class of multi-resistive state element 710 are perovskites that include two or more metals, the metals being selected from the group consisting of transition metals, alkaline earth metals and rare earth metals. The perovskites can be any number of compositions, including manganites (e.g., Pr0.7Ca0.3MnO3, Pr0.5Ca0.5MnO3 and other PCMOs, LCMOs, etc.), titanates (e.g., STO:Cr), zirconates (e.g., SZO:Cr), other materials such as Ca2Nb2O7: Cr and Ta2O5: Cr, and high Tc superconductors (e.g., YBCO). Specifically, MnO3, when combined with the rare earth metals La, Pr or some combination thereof and the alkaline earth metals Ca, Sr or some combination thereof have been found to produce a particularly effective multi-resistive state element 710 for use in the memory plug 305 or 610. The compounds that make up the perovskite class of multi-resistive state elements 710 include both normal conductive metal oxides and conductive complex metal oxides.

Figure 8B:
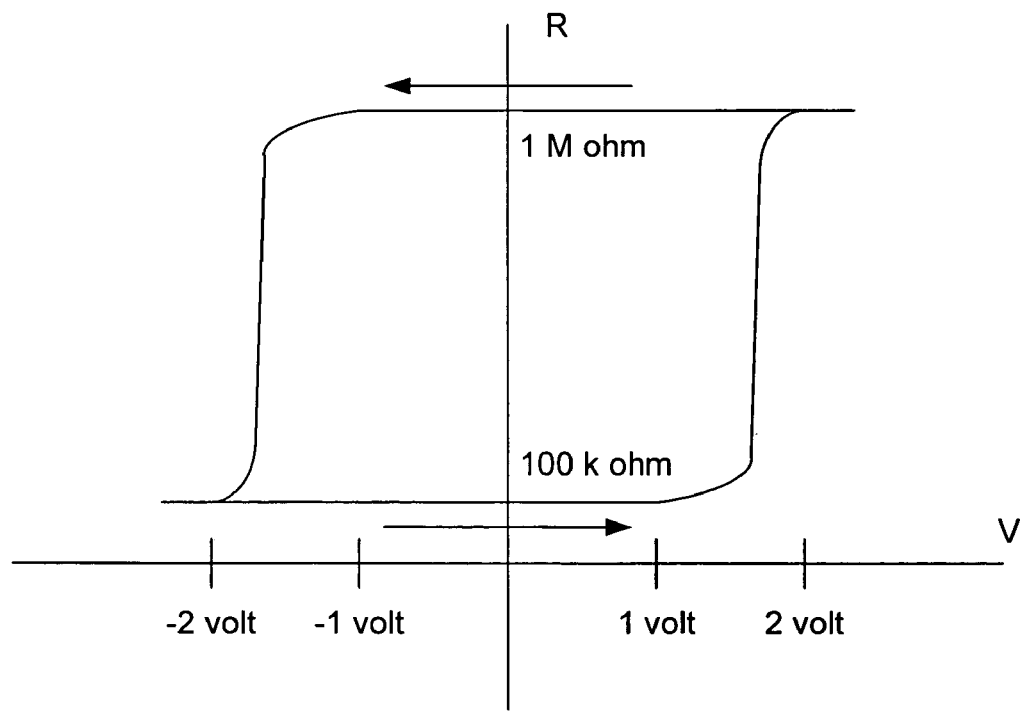
FIG. 8B depicts a graph illustrating exemplary RV characteristics of a memory element initially biased in a direction opposite to the memory element of FIG. 8A.

Multi-resistive state elements 710, however, are not limited to perovskites. Specifically, any material that has a hysteresis effect similar to what is shown in FIG. 8A or 8B could be used in the memory plug 305 or 610. Trapped charges are one mechanism by which the hysteresis effect is created.

Some examples of amorphous materials exhibiting such hysteresis include SiO, as described in "New conduction and reversible memory phenomena in thin insulating films" by J. G. Simmons and R. R. Verderber, Proc. Roy. Soc. A. 301, 1967 pp. 77–102, hereby incorporated by reference for all purposes. Another example is carbon doped with nitrogen, as described in "Nonvolatile memory effects in nitrogen doped tetrahedral amorphous carbon thin films" by E. G. Gerstner and D. R. McKenzie, Journal of Applied Physics, Vol. 84, Num. 10, November 1998, pp. 5647–5651, hereby incorporated by reference for all purposes.

Several different mechanisms might cause a material to have trapped charges. Co-pending U.S. patent applications, "A 2-Terminal Trapped Charge Memory Device with Voltage Switchable Multi-Level Resistance," U.S. application Ser. No. 10/634,636, filed Aug. 4, 2003, and "Multi-resistive state element That Uses Dopants," U.S. application Ser. No. 10/604,606, filed Aug. 4, 2003, both already incorporated by reference, describe some mechanisms that may cause a material to have trapped charges.

The Multi-Resistive State Element/Electrode Interface

Trapped charges can be further encouraged at the interface between the multi-resistive state element 710 and its electrode 705 and 715. Although the interfaces between the multi-resistive state element 710 and both the top electrode 715 and the bottom electrode 705 can be treated, it is often useful to only treat one interface. Properly treating a single interface, or subjecting the two interfaces to dissimilar treatments, can bias the memory element in a single direction, thereby encouraging the hysteresis effect.

Treatment of the interface can occur through, for example, ion implantation. In ion implantation accelerated ions penetrate a solid surface up to certain depth that is determined by the ion energy. Ion implantation can be used to introduce dopants, to form buried layers, and to modify solid surfaces. Ion implantation can occur after the bottom electrode 705 is deposited, after the multi-resistive state material 710 is deposited, or after the top electrode 715 is deposited.

Another treatment method is to expose the bottom electrode 705, the multi-resistive state material 710, or the top electrode 715 to either an anneal or a gas at a given temperature within a given ambient. Some anneals can be easily integrated into fabrication. For example, if the array 100 or 500 only has a single memory plug 305 or 610 layer, then the bottom electrode 705 might be subjected to high temperatures in order to properly form the multi-resistive state material 710. However, the top electrode 715 can then be deposited at temperatures far below what is necessary for forming the multi-resistive state material 710. Similar results can be obtained by laser treating one of the surfaces, or exposing one of the surfaces to a plasma process (such as plasma etching).

Yet another treatment method is to insert a layer of material in between one of the multi-resistive state material 710/electrode 705 or 715 interfaces. Common deposition techniques include sputtering, chemical vapor deposition, evaporation, and atomic layer deposition. Such a material might be deposited solely for the purpose of treating the interface, or might serve multiple purposes, such as additionally acting as a seed layer in the bottom electrode 705.

Additionally or alternatively, the layer of material might cause a chemical reaction with the multi-resistive state material 710, and perhaps the electrode 705 or 715. A reaction might simply occur as a result of the material coming into contact with the multi-resistive state material 710, or might require an anneal or exposure to a gas (either immediately after the material's deposition, or after the entire memory plug 305 or 610 is deposited).

An alternative method of causing a chemical reaction in the multi-resistive state material is to use an electrode 705 or 715 that reacts with the multi-resistive state material 710. Such an electrode 705 or 715 can either be immediately reactive, or require a catalyst for reaction (such as anneal or exposure to a gas).

Another treatment method might be to expose the entire structure and/or a particular surface layer to a physical re-sputtering, typically by using Ar and/or O2 or other inert gas plasma. Re-sputtering is a technique commonly used to clean-up surfaces. Since a new film is not deposited when the plasma hits the surface in the sputtering chamber, it can be considered to be the opposite of sputtering. Similarly, the surface can be exposed to an inert ion from an ion gun, bombarding the surface with accelerated inert ions, such as ionized Ar.

Fabrication Examples

Figure 9:
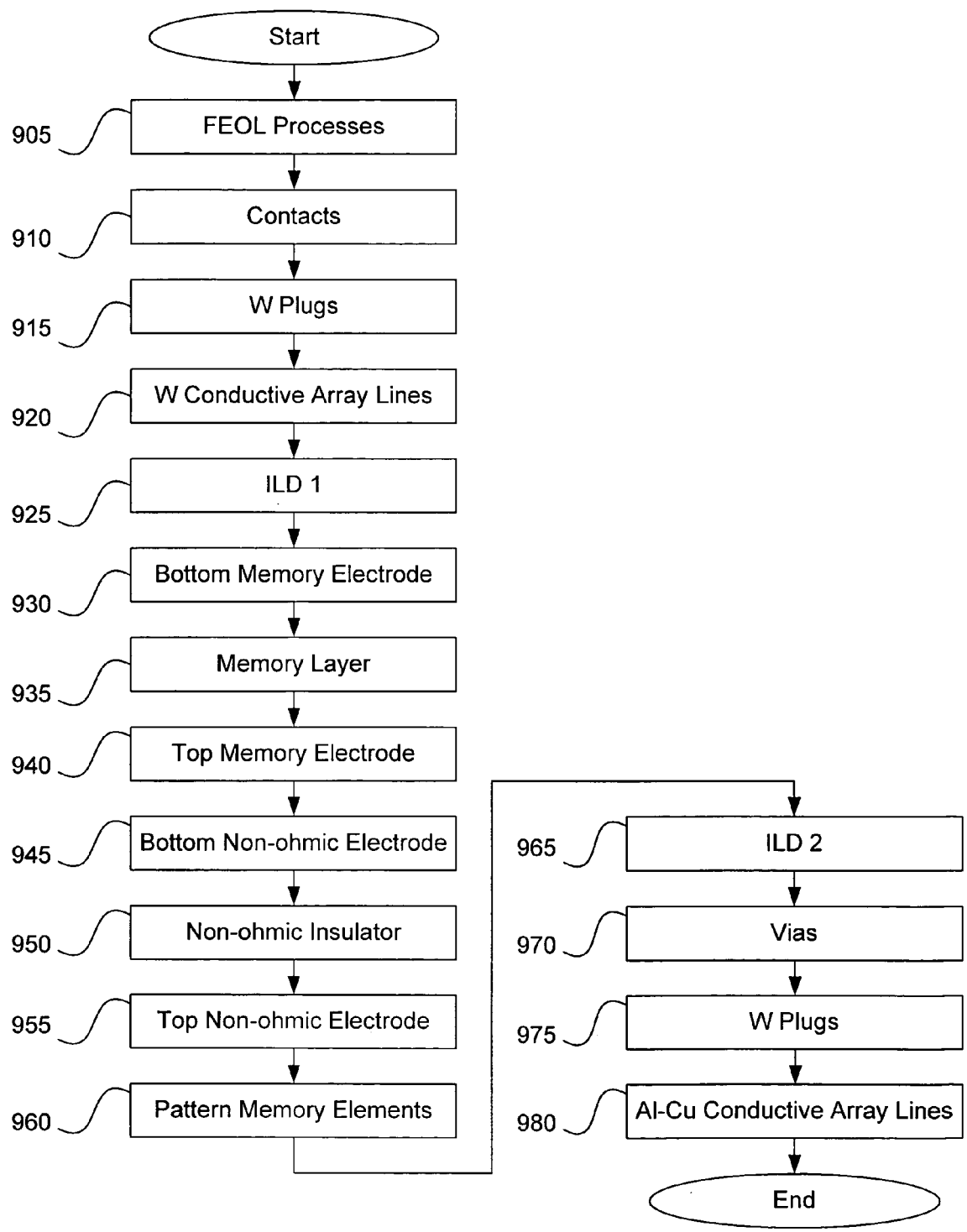
FIG. 9 is an exemplary flow chart of various processing steps that could be involved in a cross point array.
Figure 10:
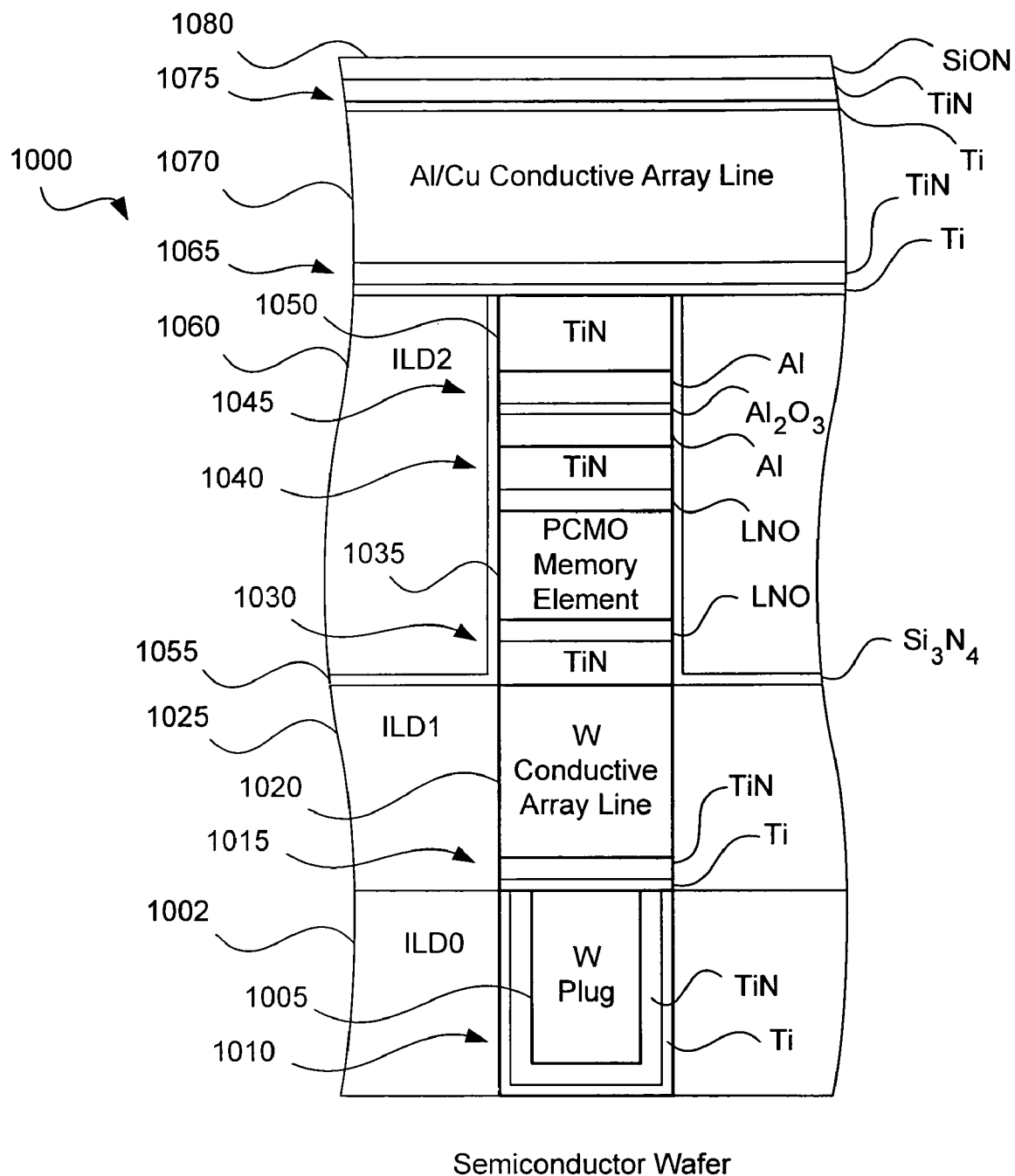
FIG. 10 is an elevation view of an exemplary memory cell that is formed using the processing steps of FIG. 9.

FIG. 9 is an exemplary flow chart of various processing steps that could be involved in an exemplary cross point array. FIG. 10 is an elevation view of a cell 1000 formed with the processing steps. At 905, standard front end of line (FEOL) processes can be used to form the active circuitry that drives the cross point memory array. FEOL processes are generally defined as operations performed on a semiconductor wafer in the course of device manufacturing up to first metallization, and might end with chemical-mechanical polishing (CMP) of an inter-layer dielectric (ILD) 1002, such as SiO2.

Regardless of the FEOL process, the next processing step at 910 is formation of contact holes through the ILD 1002 to appropriate positions in the circuitry followed by W plug 1005 formation at 915. A barrier/adhesion layer 1010 of 100 Å of Ti followed by 200 Å of TiN could be sputtered on the wafer, followed by 5000 Å of W deposited using CVD, followed by etchback or CMP to remove W on the ILD surface 1002, leaving W plugs in the contact holes.

Once the plugs are formed, the W conductive array lines 1020 are patterned on the wafer at 920. Since W has a relatively high resistivity, the maximum length and minimum cross-sectional area may be limited in comparison to aluminum or copper. Specifically, the maximum length and cross-sectional area of the conductive array lines 1020 can be determined using $$R = \frac{\rho L}{A}$$

and setting a maximum resistance to about 10 kΩ in order to maintain fast access times. Assuming 5000 Å thick metallization layers and a feature size of 0.25 µm, the length of the conductive array lines 1020 would be a maximum of about 2000 µm long. The W conductive array lines 1020 can be achieved through a barrier/adhesion layer 1015 of 100 Å of Ti plus 200 Å of TiN, followed by 5000 Å of W deposition through CVD, followed by mask, etch, and resist strip steps.

Another ILD layer 1025 could be deposited over the first layer of conductive array lines at 925. The dielectric layer 1025 can be a thick layer of SiO2, deposited over the W conductive array lines 1020 by plasma-enhanced chemical vapor deposition (PECVD) and then planarized by CMP to expose the top surfaces of the W lines 1020.

At step 930 the bottom electrodes 1030 are deposited. First, a 500 Å thick barrier layer of TiAlN is deposited to prevent metal inter-diffusion, followed by a 200 Å conductive oxide layer of LaNiO3 (LNO) or SrRuO3 (SRO). These layers can be deposited by sputtering. Alternatively to the conductive oxide layer a 500 Å layer of Ir can be deposited, followed by a 200 Å layer of IrO2. These layers can be deposited by reactive sputtering from an Ir target, adding oxygen in the sputtering chamber to create the IrO2 layer.

At step 935 approximately 2000 Å of multi-resistive state element 1035 having a stoichiometry of Pr0.7Ca0.3MnO3 is deposited at about 600°C. by a physical vapor deposition technique such as sputtering. As previously explained, the multi-resistive state element 1035 would have a low resistance of 100 k Ohm and a high resistance of 1M Ohm, and would change state with a less than 50 ns flat pulse at 2V. At 940 another electrode 1040 (200 Å of LNO or SRO and another 500 Å of TiN are deposited via sputtering) is deposited on top of the multi-resistive state element 1035. At this step an electrode interface treatment, as described above, can be included to enhance the memory properties of the memory cell 1000.

At 945 through 955 the optional non-ohmic device 1045 is formed. The device 1045 can be formed by first sputtering 250 Å of Al, followed by 50 Å of Al2O3, and another 250 Å of sputtered Al. The Al2O3 could be formed by atomic layer deposition (ALD) or oxidization of Al. The Al2O3 thickness would be chosen to achieve a VNO+ of 4V. After the optional non-ohmic device 1045, another 500 Å barrier layer 1050 of sputtered TiN is optionally deposited in step 955 to prevent metal inter-diffusion.

At 960 standard photolithography and appropriate multi-step etch processes could be used to pattern the memory/non-ohmic film stack into memory cell plug. At 965 the spaces between the plugs could then be filled in by depositing a 250 Å etch stop/diffusion barrier 1055 of Si3N4, followed by a thick SiO2 interlayer dielectric (ILD) 1060, which is planarized by CMP.

An etch stop layer is used to ensure a thin-film does not get removed during processing. When etching a thin-film layer, the actual etch time is normally longer than that minimum time required to etch through the film. This overetch time, typically 20–50% of the minimum etch time, is added to allow for variations in film thickness and variations in etch rate due to pattern density. An etch stop layer, with an etch rate significantly lower than that of the film being etched, can be used to protect the layers beneath it from attack during the overetch time. The etch stop layer can later be removed or etched through in selected locations by using a different etch method (e.g. different chemistry) producing a high etch rate for the etch stop layer and a lower etch rate compared to underlying layers.

The diffusion barrier 1055 additionally protects the memory plugs from inter-diffusion with the surrounding dielectric 1060. Regardless of whether such an insulating barrier 1055 is necessary for the entire plug, or only certain components, it is often useful to coat the entire plug with the diffusion barrier 1055 for simplicity.

At 970 via holes are formed (not shown in FIG. 10). Via holes with W plugs could be formed to contact the tops of the memory cell islands and are one mechanism that can be used to provide connections between metal interconnect layers. Standard photolithography and a 2-step via etch (stopping first on the Si3N4 layer 1055, then etching through it) could be used to expose the tops of the memory cell islands. These via holes could be filled by depositing 100 Å of Ti, followed by 200 Å of TiN, followed by a 5000 Å W layer. CMP could then be used to remove W on the ILD surface 1060, leaving the W plugs in the via holes.

If there are no more memory elements to form at high temperature, the final layer of conductive array lines may comprise aluminum, copper or other high conductivity metal. A top layer of conductive array lines could then be formed at 980 by depositing, in order, another barrier/adhesion layer 1065 of 100 Å of Ti and 200 Å of TiN, then the conductive array line 1070 comprising 5000 Å of an Al/Cu mixture, and then a final barrier/adhesion layer 1075 of 100 Å of Ti, 200 Å of TiN. An anti-reflective coating (ARC) 1080, such as SiON could also be deposited. A final mask, etch and resist strip would then be performed. The final cross-point memory array could then be 16384 W conductive array lines by 4096 Al/Cu conductive array lines to create a 64 Mbit array. 16 of these arrays could be laid side-by-side to create a 1 Gbit memory.

Note that the above example assumes that memory elements are formed by a high temperature process that could be incompatible with conventional aluminum and copper deposition processes. Other processes for forming memory elements at low temperatures exist. These include facing target sputtering and laser annealing, which are described in co-pending U.S. patent applications, "Laser Annealing of Complex Metal Oxides (CMO) Memory Materials for Non-Volatile Memory Integrated Circuits," U.S. application Ser. No. 10/387,799, filed Mar. 13, 2003, and "Low Temperature Deposition of Complex Metal Oxides (CMO) Memory Materials for Non-Volatile Memory Integrated Circuits," U.S. application Ser. No. 10/387,773, filed Mar. 13, 2003, both hereby incorporated herein by reference in their entireties and for all purposes.

Similarly, FIGS. 11–15 describe one possible technique that can be used to fabricate an exemplary two-dimensional transistor memory array, using specific materials.

Figure 11:
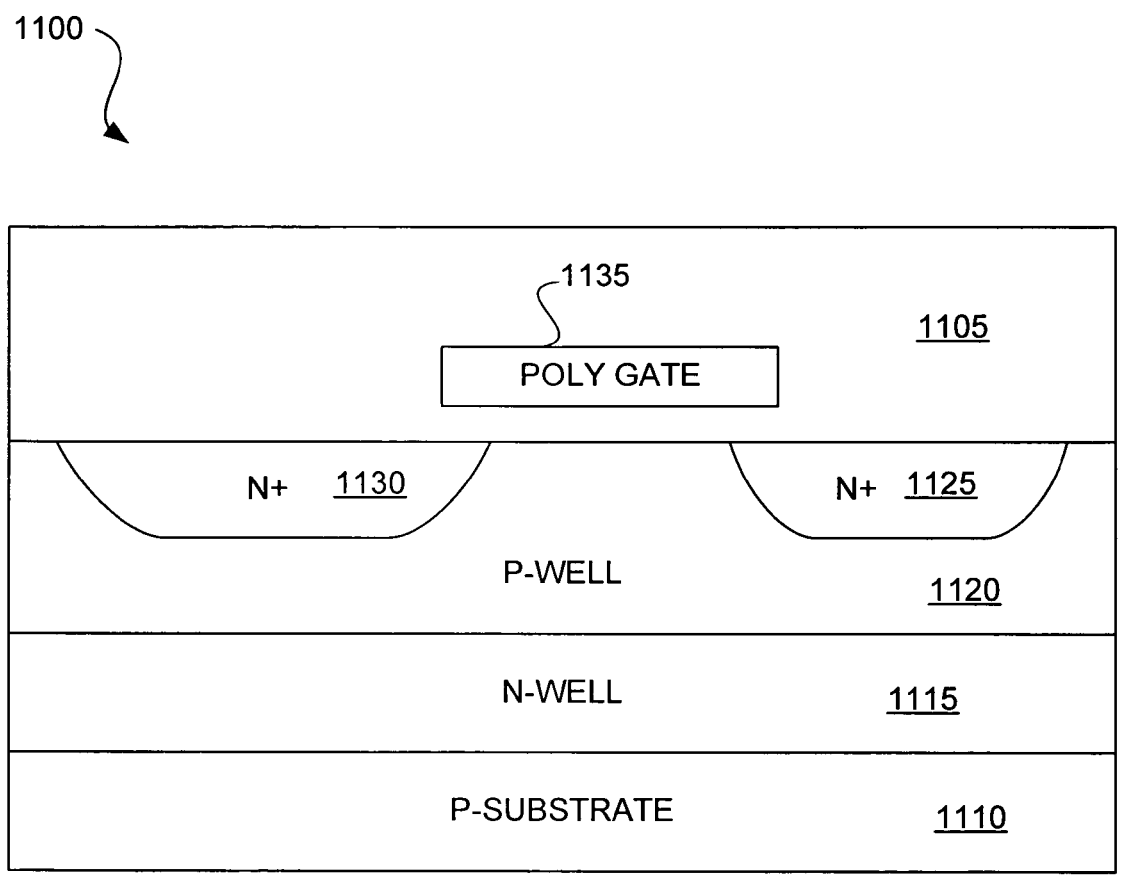
FIG. 11 depicts a cross sectional diagram of a partially formed cell after standard front end of line processes are completed.

FIG. 11 is a cross sectional diagram of a partially formed cell 1100 after standard front end of line (FEOL) processes are completed. A p-type substrate 1110, which lies beneath an n-well 1115, which, in turn, is underneath a p-well 1120 is depicted. N-junctions 1125 and 1130 are-formed in the p-well 1120. Since the data lines may be at −2V, the isolated p-well 1120 allows the n-junctions 1125 and 1130 to always be reverse-biased, even at negative voltages. A select line 1135 can be formed as a standard polysilicon gate. The FEOL processes generally ends with a chemical-mechanical polishing (CMP) of SiO2 as an inter-layer dielectric (ILD) 1105.

Figure 12:
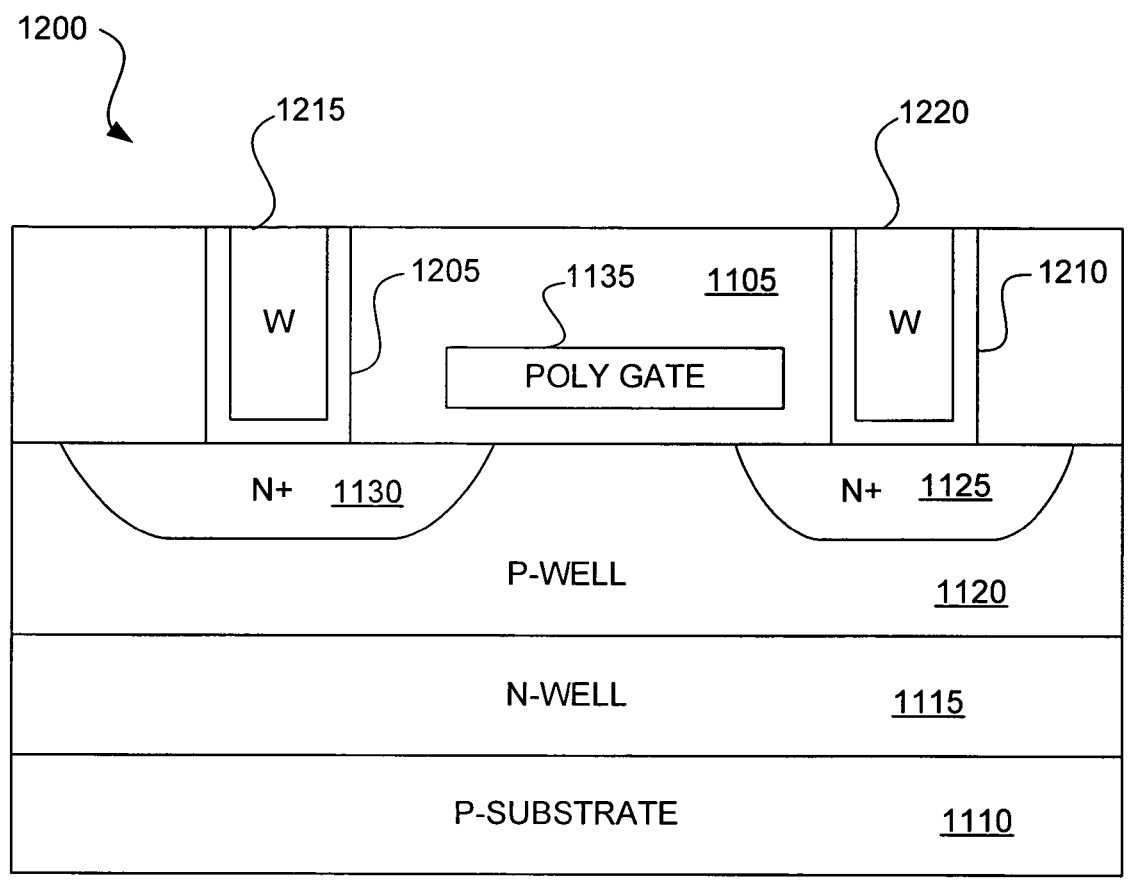
FIG. 12 depicts a cross sectional diagram of the partially formed cell of FIG. 11 after tungsten plug formation.

FIG. 12 is a cross sectional diagram of a partially formed cell 1200 after tungsten (W) plug formation. After the FEOL process, the next processing step is formation of contact holes through the ILD 1105. A barrier/adhesion layer 1205 and 1210 of 100 Å of Ti followed by 200 Å of TiN can be sputtered on the wafer, followed by 5000 Å of W, deposited using CVD, followed by etchback or CMP to remove W on the ILD 1105 surface, leaving W plugs 1215 and 1220 in the contact holes.

Figure 13:
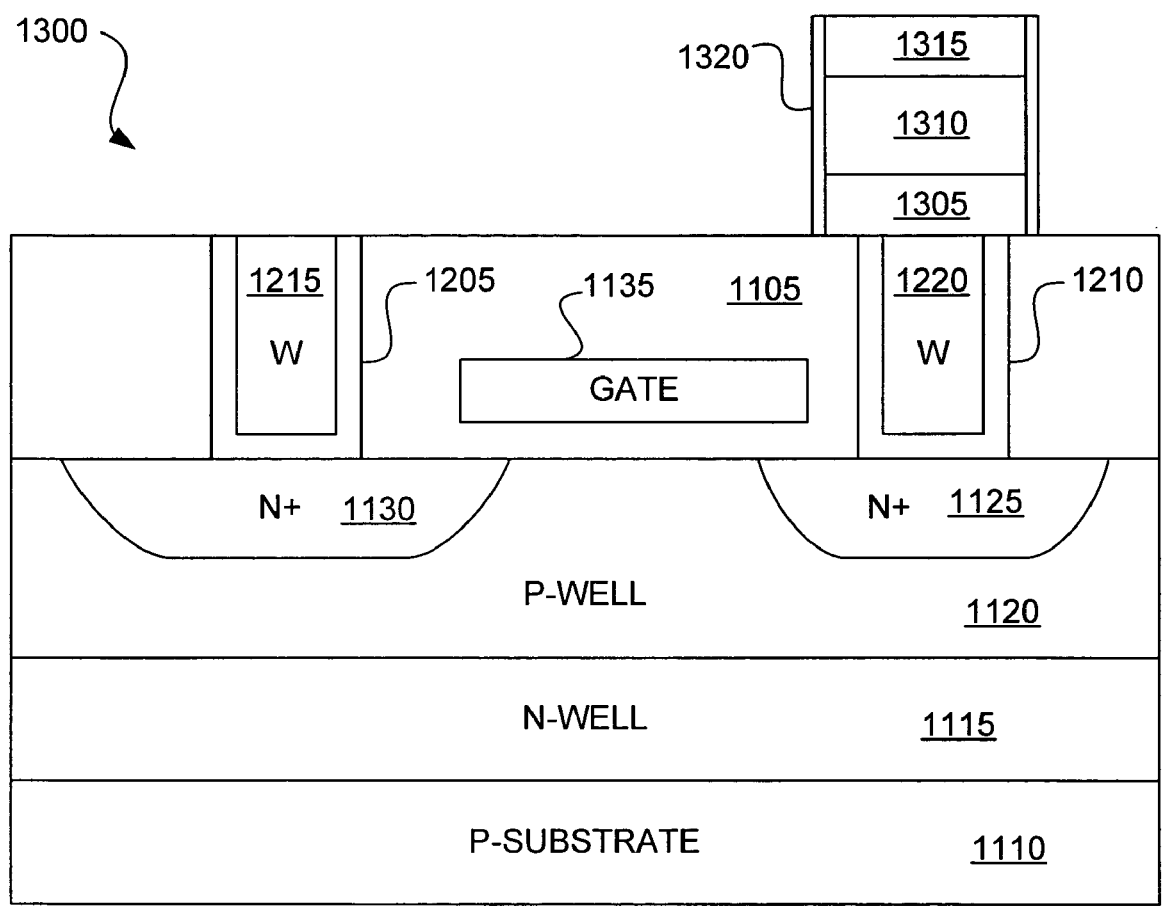
FIG. 13 depicts a cross sectional diagram of the partially formed cell of FIG. 12 after the memory plugs are formed.

FIG. 13 is a cross sectional diagram of a partially formed cell 1300 after the memory plugs are formed. First, the bottom electrode 1305 is deposited. The bottom electrode 1305 can have two layers, a 500 Å thick barrier layer of TiAlN to prevent metal inter-diffusion, followed by a 200 Å seed layer of LaNiO3. These layers can be deposited by sputtering. Alternatively to the LaNiO3 layer a 500 Å layer of Ir can be deposited, followed by a 200 Å layer of IrO2. These layers can be deposited by reactive sputtering from an Ir target, adding oxygen in the sputtering chamber to create the IrO2 layer.

2000 Å of multi-resistive state element 1310 having a stoichiometry of Pr0.7Ca0.3MnO3 can then be deposited at about 600° C. by a physical vapor deposition technique such as sputtering, and then annealed. The top electrode 1315 (200 Å of SrRuO3 and another 500 Å of TiAlN) is deposited on top of the memory element 1310 via sputtering. Alternatively the top electrode 1315 can be deposited as 200 Å of IrO2, 500 Å of Ir and 500 Å of TiAlN via sputtering. At this step an electrode interface treatment, as described above, can be applied to the layers 1305, 1310, and 1315 to enhance the memory properties of the memory cell 1300. Standard photolithography and appropriate multi-step etch processes can then be used to pattern the electrode/memory/electrode layers into memory cell plug. 250 Å of Si3N4 or TiO2 might then be deposited as an etch stop/diffusion barrier 1320, to protect the PCMO film from inter-diffusion.

Figure 14:
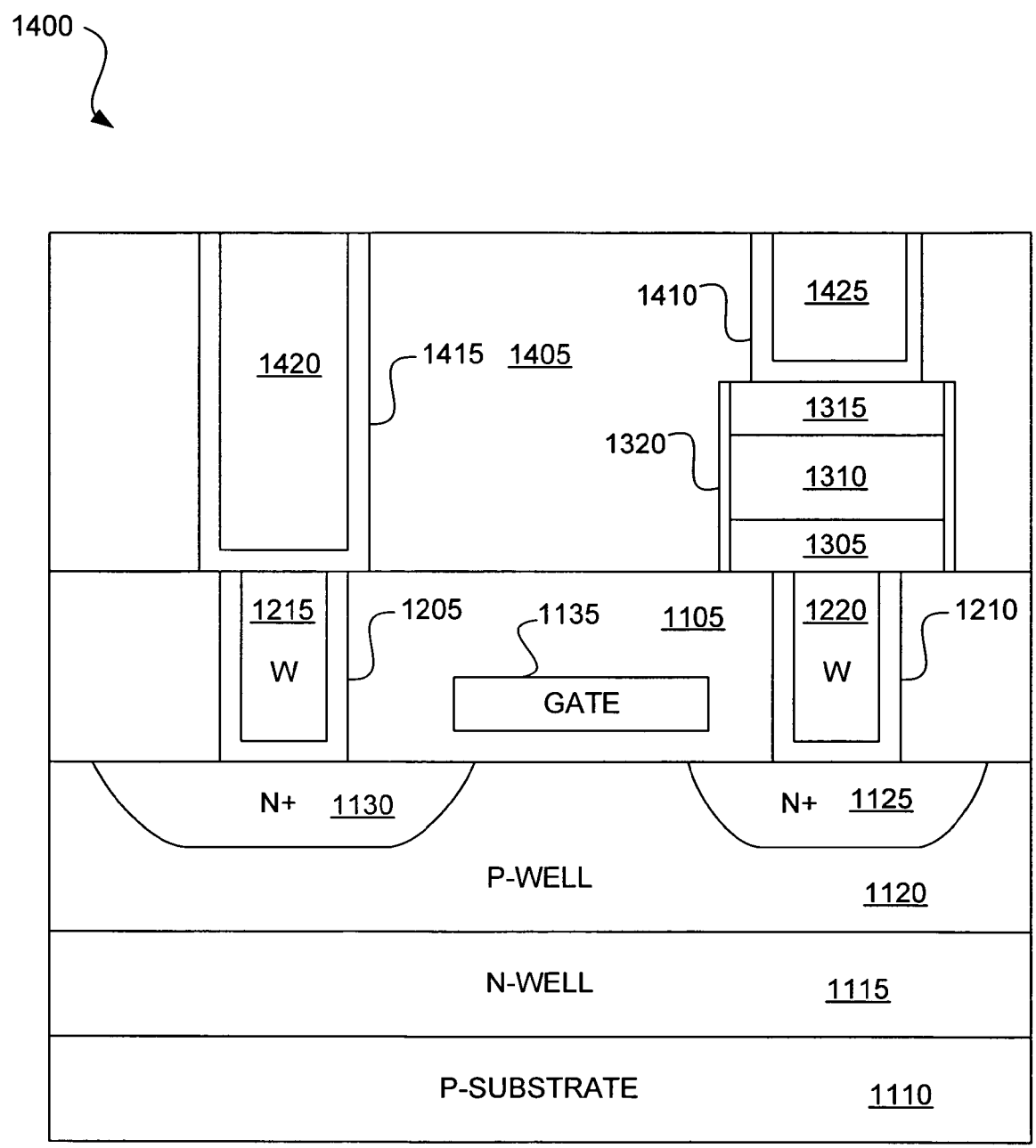
FIG. 14 depicts a cross sectional diagram of the partially formed cell of FIG. 13 after the second set of W plugs are formed.
Figure 15:
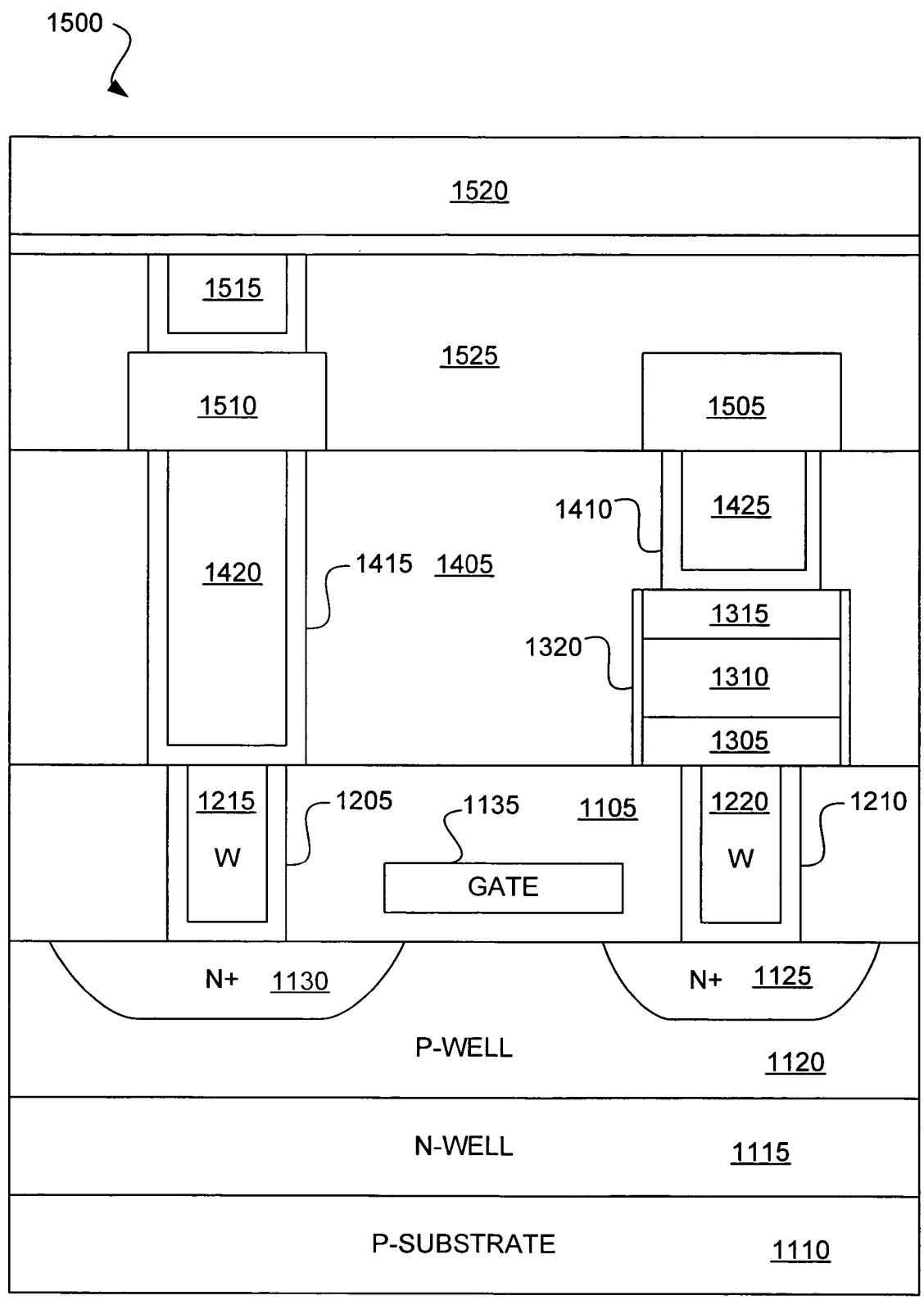
FIG. 15 depicts a cross sectional diagram of a completely formed cell.

FIG. 14 is a cross sectional diagram of a partially formed cell 1400 after the second set of W plugs are formed. After the memory plug is fully formed, a thick SiO2 layer as a second ILD 1405 is deposited and planarized by CMP. The via holes are then formed with standard photolithography and via etch. The via holes could be filled by depositing a barrier/adhesion layer 1410 and 1415 of 100 Å of Ti, followed by 200 Å of TiN, followed by W plug layer 1420 and 1425 of 5000 Å of W. CMP could then be used to remove W on the ILD surface 1405, leaving the W plugs 1420 and 1425 in the via holes FIG. 15 is a cross sectional diagram of a completely formed cell 1500. Using standard processes, two metallization layers can be formed above the partially formed cell 1400 of FIG. 14. The first metallization layer can be used to form both the reference line 1505 and a metal pad 1510, which eventually connects two tungsten plugs 1420 and 1515. The second tungsten plug 1515 is used to connect the data line 1520, which is formed during the second metallization layer, to the metal plug 1510, through a third ILD 1525, which is used to support the data line 1520.

Read and Write Operations

Figure 16:
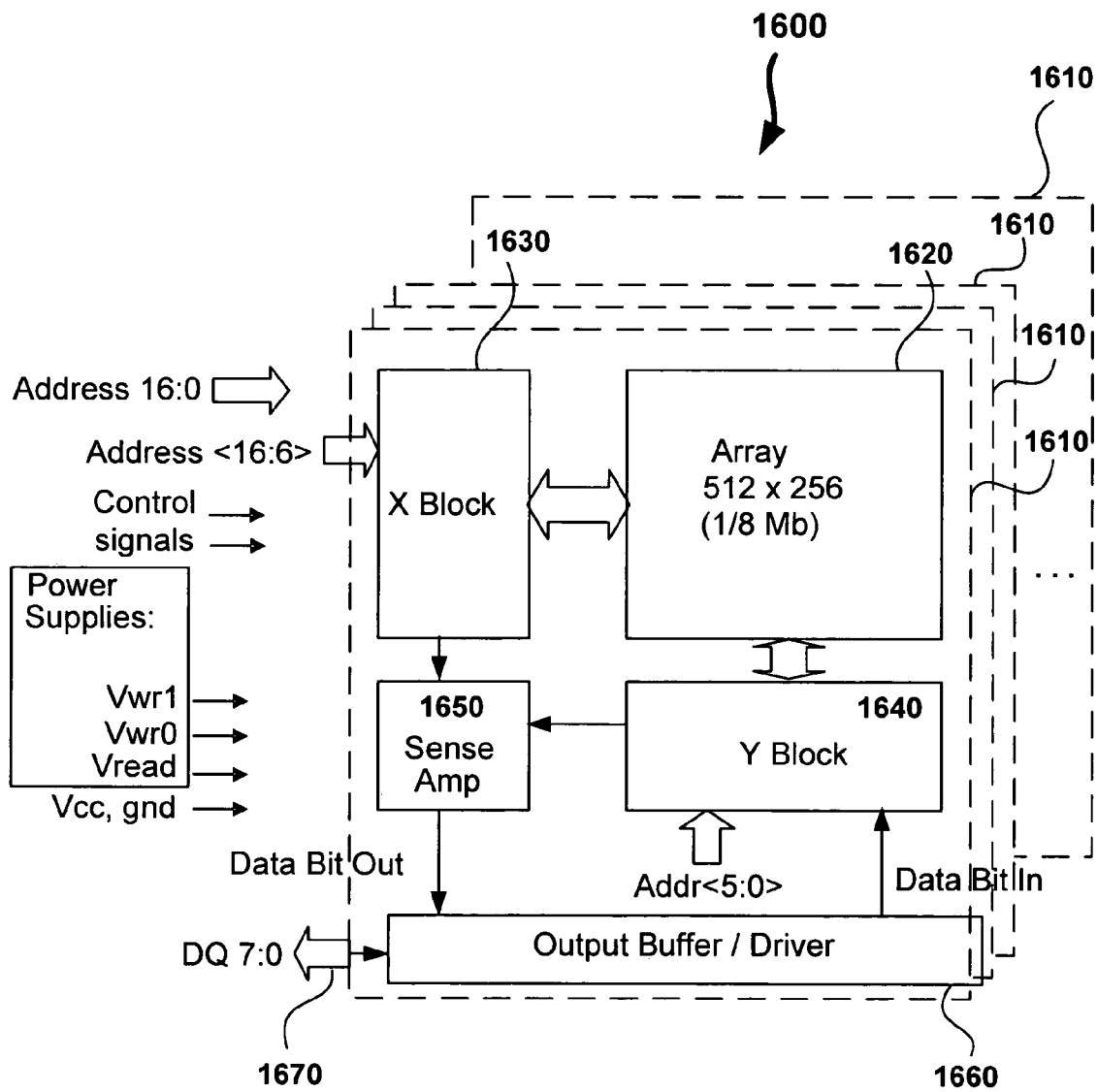
FIG. 16 depicts a block diagram of a cross point memory array without a page or burst mode implementation.

Recall that cross point arrays 100 constructed utilizing two-terminal memory plugs 115 suffer from difficulties in reading and writing multiple memory plugs simultaneously. FIG. 16 illustrates a simplified block diagram of an exemplary memory chip 1600 having multiple logical memory bit blocks 1610. Physical layouts might differ, but each memory bit block 1610 is typically formed on a separate portion of a semiconductor substrate. Each memory bit block 1610 operates on one line of the memory chip data bus 1670.

Each memory bit block 1610 has a cross point memory array 1620 connected to peripheral circuitry including an x-block 1630 for applying voltage to the various x-direction lines of the memory array 1620. Each layer 1610 also has a y-block 1640 for applying voltage to the y-lines, sense amp 1650 acting as sensing circuits for sensing current output from either the x-lines, the y-lines, or both, and an output buffer/driver 1660. In write operations only a single bit is written at a time. Thus, the driver 1660 can only send one bit at a time to the y-block 1640 for writing to the array 1620. Switches or pass gates within y-block 1640 can ensure that the desired y-line is selected.

Figure 17:
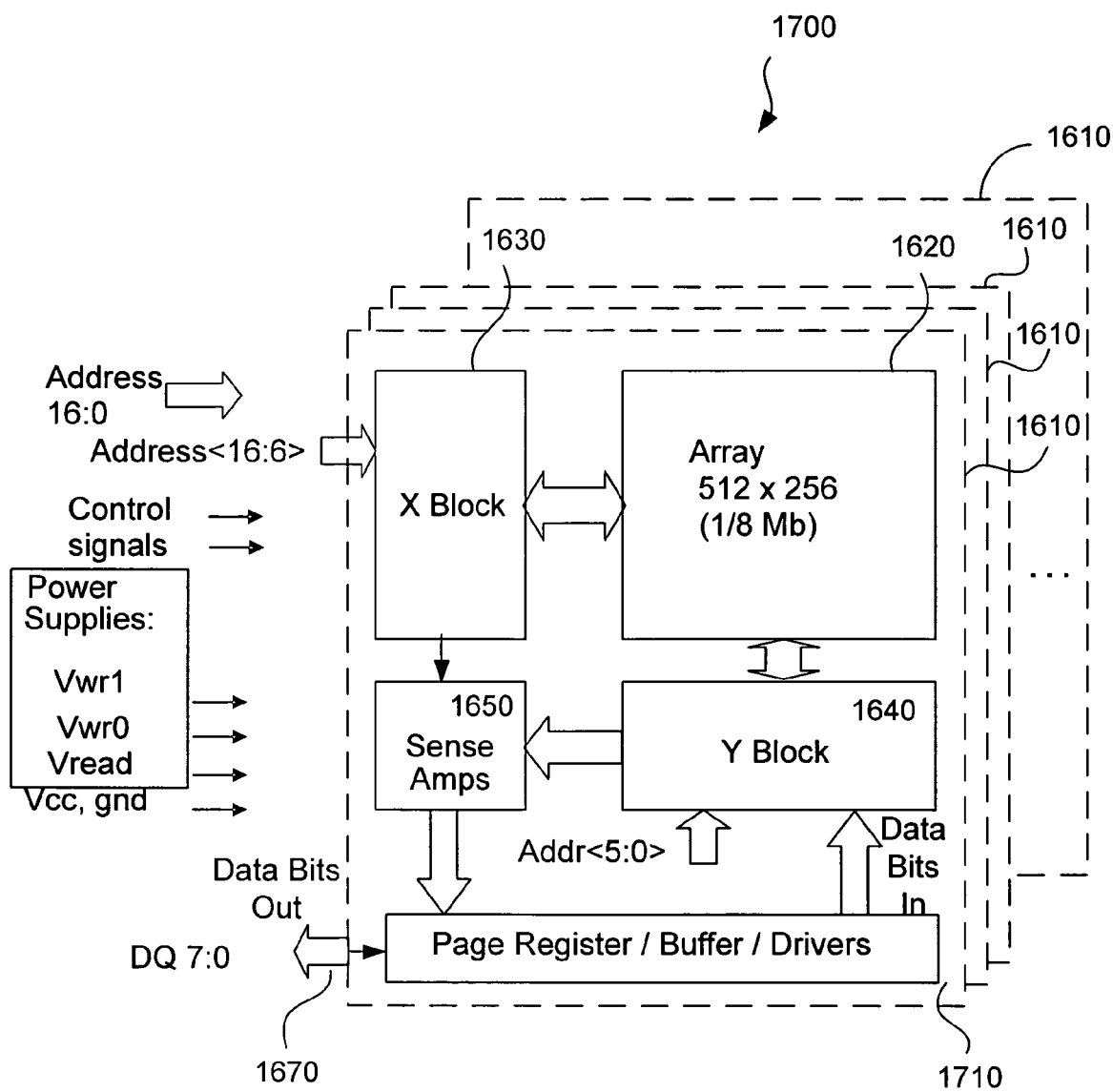
FIG. 17 depicts a block diagram of a cross point memory array configured to read and write data in page mode and burst mode, in accordance with an embodiment of the invention.

To improve the write time, driver circuits can be constructed to write all binary 1's simultaneously, then write all binary 0's. In this fashion, data are written in two operations, rather than requiring one operation for every bit of data. FIG. 17 illustrates a memory chip 1700 configured to carry out simultaneous reads and writes of multiple memory plugs. The memory chip 1700 is configured similar to memory chip 1600 but with a circuit block 1710. The circuit block 1710 contains components such as page register, buffer, and driver circuits that allow the y-block to write multiple bits of data simultaneously. The page register can include as many page latches as the page size requires. During write operations, each page latch stores the data coming from one line of the data bus 1670, and sends the data to a driver circuit, which then applies to the array a voltage capable of writing the desired data to the array 1620. During read operations, buffers may be used to send data received from the sense amps, decoded by the appropriate page of burst mode logic, to the memory data bus 1670.

Figure 18:
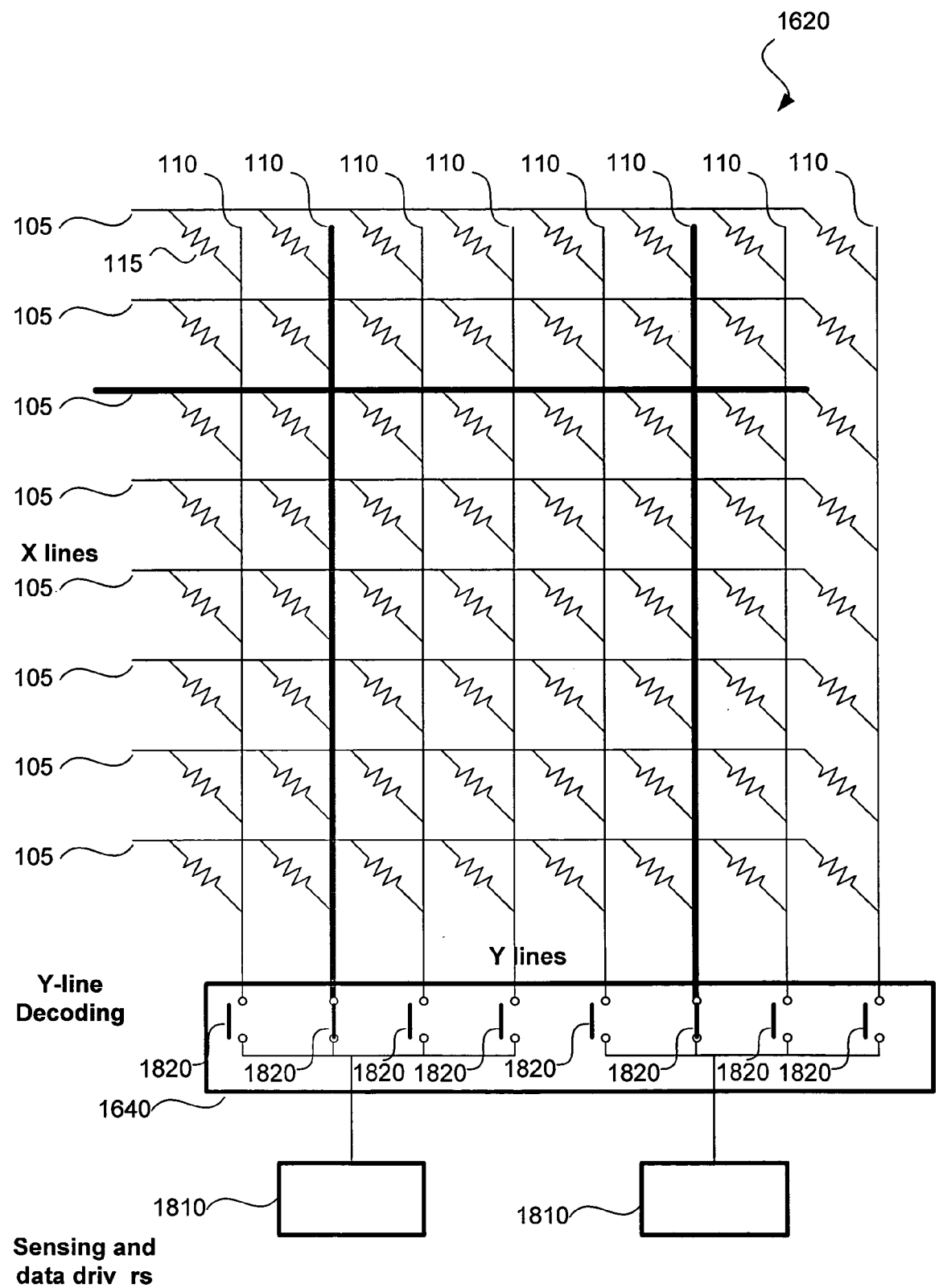
FIG. 18 depicts cross point memory circuit elements constructed in accordance with an embodiment of the invention.

To further illustrate the interaction between the circuit block 1710 and y-block 1640 that allows for simultaneous reads and writes of multiple bits at a time, FIG. 18 illustrates further details of the cross point memory array 1620, y-block 1640, and circuit block 1710. In read operations, the x-block 1630 can apply a voltage to the highlighted x-line. The y-block 1640 will decode which y-lines 110 are selected and apply a voltage to those y-lines. For each selected y-line there can be a corresponding block 1810, which includes a sensing circuit and a data driver. During read, the appropriate switch 1820 will be closed, and a known voltage difference will be applied between the appropriate x-line and y-line, thus allowing a current to pass from the selected x-line to the selected y-line through the selected cell at the intersection of the x-line and y-line. Non-selected lines are typically held at ground or some intermediate voltage. Each sensing circuit 1810 then translates the current value measured from each selected y-line into a corresponding bit (or bits if each memory plug holds multiple bits of information) of binary information. Because the highlighted x-line applies the same voltage to each attached memory plug, the sensing circuit 1650, or its components in each circuit 1810, can sense current values and read data from either every memory plug attached to the selected x-line or every selected y-line simultaneously.

The circuit block 1710 also allows for the simultaneous writing to multiple memory plugs. In write operations, bits are sent to driver circuits 1810 within the circuit block 1710 for writing, typically as an entire page. The driver circuits 1810 include latch circuits for storing data. The x-block 1630 and appropriate driver circuits 1810 are then activated to write the binary 1's of the word in a single operation, then the binary 0's in another operation. More specifically, if as in previous examples each memory plug 115 is fabricated so as to switch to a high resistive state upon application of +4V and a low resistive state upon application of −4V, and the high resistive state represents a binary 1, the appropriate x-line is first energized to +2V. For those memory plugs that are to have a binary 1 written to them, the driver circuits 1810 then energize the appropriate y-lines to −2V so as to induce the high resistive state, i.e., a binary 1. In the next cycle, the x-block 1630 then switches the polarity of the x-line to −2V, and the appropriate driver circuits 1810 energize the y-lines that are to have a binary 0 written to them to +2V. In this manner, all binary 1's of a word can be written during one cycle where the x-line is set at +2V, and all binary 0's of the word can be written during a subsequent cycle where the x-line is set at −2V. The installation of a circuit block 1710 with a driver circuit for each selected y-line thus allows multiple bits of data within a cross point array, i.e. multiple binary 1's or 0's, to be written in 2 write cycles. If multiple bits are stored in a single memory plug (e.g., the cell has a low state, medium-low state, medium-high state and high state), either a separate cycle could be used for every resistive state or the selected y-lines could be held to a voltage appropriate for each specific resistive state. In the latter case, the first cycle could be devoted to, for example, raising a memory plug's the resistance and the second cycle could be devoted to lowering a memory plug's resistance.

It should be noted that not all of the memory plugs on the selected x-line may need to have a write operation performed. For example, if a memory plug were already in its intended resistive state (e.g., it already stores a 1, and a 1 is to be written), there would be no need to re-write to it. In certain cases, it may even be detrimental to apply a write voltage to the memory plug that is already in its intended state. However, a feedback circuit, such as one disclosed in co-pending application, "An Adaptive Programming Technique for a Re-writable Conductive Memory Device," filed Oct. 6, 2003, with Ser. No. 10/680,508, already incorporated by reference, would prevent any over-charging of the memory plugs 115.

The reading of data from a memory array 1620 is relatively straightforward: an x-line is energized, and current is sensed by the sensing circuits 1650 and converted to bits of information. As such, the simultaneous reading of multiple bits involves simply employing the sensing circuit 1650 to sense current from multiple y-lines 110 simultaneously. Conversely, the writing of data to the memory array 1620 is accomplished by noting, for each bit, whether a 1 or 0 must be written, then writing either the 1's or 0's simultaneously. This is accomplished via the driver circuits 1810. Specifically, when binary information is sent to the memory chip 1700, it is stored in latch circuits within the circuits 1810. Each y-line 110 can either have an associated driver circuit 1810 or a group of y-lines can share a single driver circuit 1810 if the non-selected lines in the group are held to a constant voltage that would not cause the unselected memory plugs to experience any change in resistance. The driver circuit then writes the 1 or 0 to the appropriate memory plug during the appropriate cycle. For example, there may be 1024 y-lines in a cross point array, and the page register may include 8 latches, in which case the y-block would decode 1 out of 128 y-lines and connect this selected line to block 1810.

It is to be noted that such an architecture can be expanded to create a cross point array memory where one array handles all the bits of the data bus, as opposed to having multiple arrays, or memory bit blocks as described above, handle each one bit of the data bus. For example, if the data bus, or memory data organization, also called data width, is 16-bit wide, the y-block of one cross point array can be made to decode 16 lines simultaneously. By applying the techniques of simultaneous reads and 2-cycle writes taught above, such a memory chip with only one cross point array can read and program 16-bit words.

FIG. 19A illustrates an exemplary latch, driver and sensing circuit 1810 that can be used in a circuit block 1710 in accordance with an embodiment of the invention, so as to accomplish two-cycle write operations. The circuit 1810 includes a page latch 1900 for storing 1 bit of information, AND gates 1910 that receive signals from the page latch 1900 and inputs 1912 and 1914, an inverter 1920, and two drivers 1930 and 1940. The page latch 1900 is configured to hold a signal (either high or low signal depending on whether a 1 or 0 is received). Similarly, the inputs 1912, 1914 are configured to receive the signal sequence shown in FIG. 19B. As one skilled in the art will appreciate, the write 1 signal is only high during the cycle where a write command is received, and the write 0 signal is only high during the cycle immediately following the write 1 cycle. It should be noted that the duty cycle of the write 0 and write 1 operations can either correspond to the system clock, some fraction or multiple thereof, or can be asynchronous. In one embodiment of the invention, a separate driver circuit 1810 is electrically connected to each y-line 110, so as to individually write data to a memory plug in communication with that y-line.

On receipt of a high or low signal, the page latch 1900 then continues to emit a corresponding high or low signal for as long as is necessary to complete the two-cycle write. When it is desired to write this 1 or 0 to the appropriate memory plug, circuitry then transmits the signals of FIG. 19B to each AND gate 1910. Specifically, a high signal is sent to the input 1912 of the AND gate 1910 attached to the 1 driver 1930 during a first cycle, followed by a high signal to the other input 1914 during a second cycle. One of skill can see that either the 1 driver 1930 or the 0 driver 1940 will then be triggered to apply a write voltage to the y-line, as shown in the table of FIG. 19C. In this manner, a bit is written to the page latch 1900, and either its 1 driver 1930 or 0 driver 1940 will apply +2V or −2V to the y-line so as to write this bit to an associated memory plug within two cycles. It can also be seen that electrically connecting each y-line of a word, or other group of memory plugs, to a group of driver circuits 1810 allows that entire word or group of data to be written in two cycles, i.e. one cycle to write the binary 1's, and one to write the binary 0's.

While these driver circuits 1810 allow for two-cycle write operations, it would also be desirable to conduct read and write operations in both page and burst modes, so as to further speed reads and writes. As discussed above, read operations in page mode can be accomplished by reading multiple words (or other groupings of data) from the memory plugs 115 to the sensing circuits 1650, which then simply output the appropriate words, possibly buffering the data so that it could be output when desired, based on receipt of an address bit or bits identifying a particular word.

When read operations are to be performed in burst mode, multiple words or other data are read into a buffer within the circuit block 1710, and are output sequentially upon receipt of signals from a burst clock or other known device for generating a trigger signal at a particular time. Typically, the burst clock signal triggers the circuit block 1710 to output words or other data groupings in an orderly fashion, such as one at a time from left to right y-lines 110.

Write operations are performed in page mode or burst mode according to specific signals sent to the inputs 1912 and 1914. Once data is input to the page latches 1900, the signals to the inputs 1912 and 1914 are simply timed so that multiple such signals are sent to multiple latches 1900 simultaneously. In this manner, multiple driver circuits 1810 write their information to a cross point array 1620 simultaneously, in either page mode or burst mode. It is to be noted that write 1 cycle signal 1912 and write 0 cycle signal 1914 will also control the X-block 1630 in order to switch the selected x-line polarity, for example from +2V in the first cycle to −2V in the second cycle.

Figure 20A:
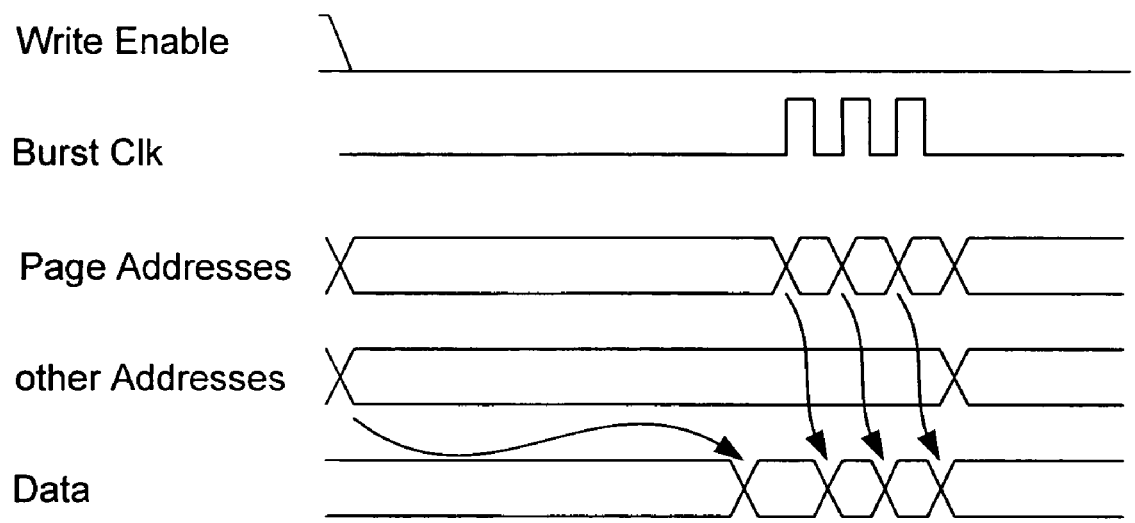
FIG. 20A depicts input and data signals for reading information in page or burst mode.

FIG. 20A further exemplifies the behavior of the memory chip during a page or burst read. The Write Enable signal is set low, which sets the chip for a read operation. An address is asserted on the address bus and all bits within the page at the given address are internally read. The first data is output after a delay which corresponds to the first access time. The way the data is output is different in burst mode and in page mode. In burst mode, no page addresses are specified, but the sense amps 1650 send their data to a set of logic circuits within the page register, the logic circuits also being connected to the data bus 1670. An external burst clock signal is used to trigger the logic circuits to sequence the output of the page data bits to the data bus. In page mode, page addresses are given, which specify which bits within the page are being output. More specifically, known decoder circuits are employed within the page register to receive page address signals and decode these address signals into an order in which bits are to be output to the data bus 1670. Although both burst clock and page addresses signals are shown on FIG. 20A, only one of these signals would be used for any one given mode. Many variations can be inferred by those skilled in the art as to whether the first address may be at the boundary of a page or not, or the exact shape and timing of the burst clock. In essence these variations do not alter the scope of page or burst mode operations within the memory chip.

Figure 20B:
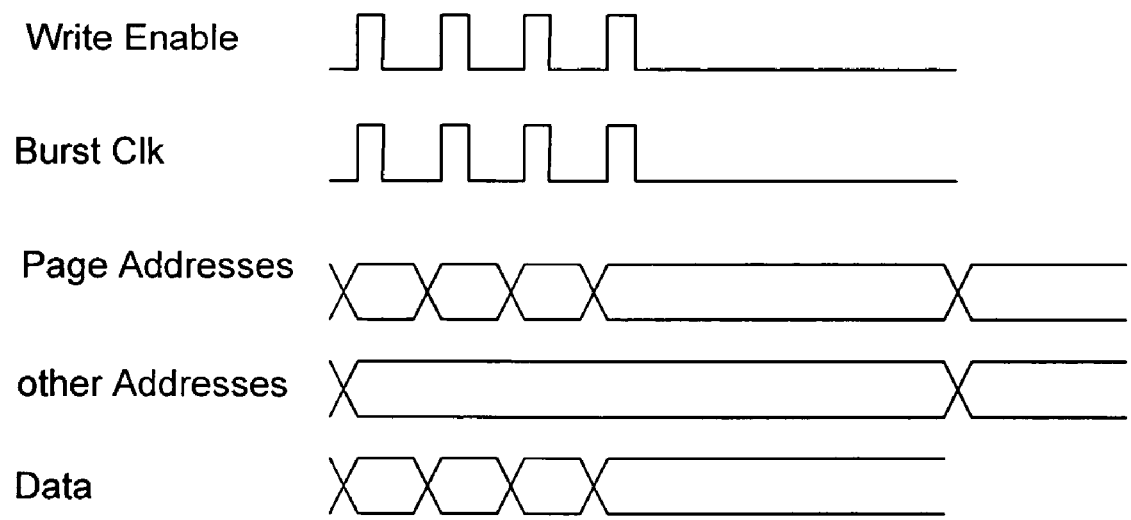
FIG. 20B depicts input and data signals for writing information in page or burst mode.

FIG. 20B further exemplifies the behavior of the memory chip during a page or burst write. In burst mode, information is sent over the bus 1670 to the logic circuits. A burst clock signal toggles repeatedly to trigger the logic circuits to latch successive bits of data. Further burst clock pulses and optional write enable pulses are used to enter further data. When the last burst clock pulse has been entered, for example the 4th pulse if the internal page is 4 words long, the internal write operation, which as above can be a two-cycle write, is triggered. As above, in page mode, the page register contains address circuits and decoder circuits. These circuits ensure that the data to be programmed is transmitted from the bus 1670 and loaded into the page register at the page address being input to the memory chip, according to a succession of write enable pulses while page data and page address signals are input to the memory chip. When the page register is full, or according to any other signal (such as a control signal or combination of signals), the memory chip triggers the address circuits to transmit their information to the appropriate decoder circuits according to the address signals. The decoder circuits then decode the data signals to binary information and send it to their associated driver circuit 1810, and the signal sequence of FIG. 19B is triggered. Although both burst clock and page address signals are shown on FIG. 20B, only one of these signals would be used for any one given mode. Many variations in the way data and addresses, as well as how the actual write operation is triggered, can be contemplated without departing from the scope of this invention.

One of skill will also realize that the methods and apparatus for accomplishing two-cycle reads and writes can be combined with those for accomplishing reads and writes in page and burst mode. For example, multiple y-lines can be selected so as to read multiple bits of information into a buffer in just two cycles. The buffer can then output this information in either page mode or burst mode. In this manner, entire words can be read and either output when identified, or output sequentially. Similarly, groups of information, such as words, can be input into a buffer and subsequently written to the cross point array 1620 in either page mode or burst mode. For instance, when it is desired to write only certain words to a cross point array 1620, an address signal can be used to identify specific words, the entirety of which can be written to the cross point array 1620 in two cycles. When it is desired to write all words in sequence, receipt of a burst clock signal can trigger the circuit block 1710 to write each successive word in turn, where each word is written in its entirety in just two cycles.

One of skill will also realize that the embodiments of the invention can also be employed to implement page and burst mode reads and writes in other forms of memory besides cross point memory arrays. As discussed in relation with FIG. 5, two-terminal memory elements can be employed in many different types of electronic memory, and one of skill will also realize that such memory can also be configured to include page and burst mode functionality. Thus, the invention should not be construed as limited to two-terminal memory elements arranged in a cross point array, and should be interpreted as including any known memory format capable of employing page and burst modes.

The foregoing description, for purposes of explanation, uses specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. Obviously many modifications and variations are possible in view of the above teachings. For instance, while the invention discloses two-cycle reads and writes, it also discloses page and burst modes, which can be performed together to accomplish, for instance, two-cycle reads and writes performed in either page mode or burst mode. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A re-writable memory, comprising:
   a substrate;
   a cross point memory array formed above the substrate, including
      a first conductive array line;
      second conductive array lines, each of the second conductive array lines oriented generally substantially perpendicular to the first conductive array line;
      two-terminal memory plugs, each memory plug having a first terminal in electrical communication with the first conductive array line and a second terminal in electrical communication with one of the second conductive array lines, and each memory plug configured to assume a first electrical resistance that corresponds to a first data state in response to a first voltage and a second electrical resistance that corresponds to a second data state in response to a second voltage;
   sensing circuits, each sensing circuit in electrical communication with one of the second conductive array lines and an associated one of the memory plugs, each sensing circuit further configured to sense an electrical current passing through said one of the second conductive array lines so as to read the first and second data states from the associated one of the memory plugs, and wherein the sensing circuits are configured to translate the first and second data states into binary information; and
   address circuits configured to identify selective ones of the sensing circuits for output of said binary information in page mode.

2. The re-writable memory of claim 1 and further comprising:
   a data bus having a plurality of data lines, each data line in electrical communication with an associated one of the sensing circuits, and each configured to receive information from the associated sensing circuit for storage in the cross point memory array so as to collectively facilitate the reading of a set of binary information from the cross point memory array.

3. A re-writable memory, comprising:
   a substrate;
   a cross point memory array formed above the substrate, including
      a first conductive array line;
      second conductive array lines, each of the second conductive array lines oriented generally substantially perpendicular to the first conductive array line;
      two-terminal memory plugs, each memory plug having a first terminal in electrical communication with the first conductive array line and a second terminal in electrical communication with one of the second conductive array lines, and each memory plug configured to assume a first electrical resistance that corresponds to a first data state in response to a first voltage and a second electrical resistance that corresponds to a second data state in response to a second voltage;
   sensing circuits, each sensing circuit in electrical communication with one of the second conductive array lines and an associated one of the memory plugs, each sensing circuit further configured to sense an electrical current passing through said one of the second conductive array lines so as to read the first and second data states from the associated one of the memory plugs, and wherein the sensing circuits are configured to translate the first and second data states into binary information; and
   a burst clock configured to trigger said sensing circuits to output said binary information in burst mode.

4. The re-writable memory of claim 3 and further comprising:
   a data bus having a plurality of data lines, each data line in electrical communication with an associated one of the sensing circuits, and each configured to receive information from the associated sensing circuit for storage in the cross point memory array so as to collectively facilitate the reading of a set of binary information from the cross point memory array.

5. A re-writable memory, comprising:
   a substrate; and
   a cross point memory array formed above the substrate, including
      first conductive array lines;
      second conductive array lines, each of the second conductive array lines oriented generally substantially perpendicular to the first conductive array lines;
      two-terminal memory plugs, each memory plug having a first terminal in electrical communication with one of the first conductive array lines and a second terminal in electrical communication with one of the second conductive array lines, the memory plugs configured to store information in a first data state and a second data state; and
   sensing circuits, each sensing circuit in electrical communication with one of the second conductive array lines and configured to sense said first data state and said second data state so as to read said information from said memory plugs, and wherein the sensing circuits are further configured to output said information in page mode.

6. The re-writable memory of claim 5 further comprising address circuits configured to identify selective ones of the sensing circuits for output of said information.

7. The re-writable memory of claim 6 wherein both the first portion and the second portion of two terminal memory plugs share a common first conductive array line.

8. The re-writable memory of claim 5 and further comprising:
   driver circuits, each driver circuit in electrical communication with the cross point memory array and operable to program the first data state in a first portion of the two-terminal memory plugs during a first cycle, and to program the second data state in a second portion of the two-terminal memory plugs during a second cycle that follows the first cycle.

9. A re-writable memory, comprising:
   a substrate; and a cross point memory array formed above the substrate, including
  first conductive array lines;
  second conductive array lines, each of the second conductive array lines oriented generally substantially perpendicular to the first conductive array lines;
  two-terminal memory plugs, each memory plug having a first terminal in electrical communication with one of the first conductive array lines and a second terminal in electrical communication with one of the second conductive array lines, the memory plugs configured to store information in a first data state and a second data state; and
  sensing circuits, each sensing circuit in electrical communication with one of the second conductive array lines and configured to sense said first data state and said second data state so as to read said information from said memory plugs, and wherein the sensing circuits are further configured to output said information in burst mode.

10. The re-writable memory of claim 9 further comprising a burst clock configured to trigger said sensing circuits to output said information.

11. The re-writable memory of claim 10 wherein both the first portion and the second portion of two-terminal memory plugs share a common first conductive array line.

12. A re-writable memory, comprising:
a substrate;
a cross point memory array formed above the substrate, including
  a first conductive array line;
  second conductive array lines, each of the second conductive array lines oriented generally substantially perpendicular to the first conductive array line;
  two-terminal memory plugs, each memory plug having a first terminal in electrical communication with the first conductive array line and a second terminal in electrical communication with one of the second conductive array lines, each memory plug configured to store an element of an information set;
a plurality of sensing circuits each configured in electrical communication with an associated one of the second conductive array lines and the memory plugs, so as to substantially simultaneously sense the elements of the information set; and
decoder circuits in electrical communication with the plurality of sensing circuits, the decoder circuits configured to determine from an address signal an order in which to output the information from ones of the plurality of sensing circuits, so as to output the information in page mode.

13. The re-writable memory of claim 12 and further comprising:
a data bus having a plurality of data lines, each data line in electrical communication with an associated one of the sensing circuits, and each configured to receive the elements of the information set from the associated sensing circuit.

14. The re-writable memory of claim 13 wherein the plurality of data lines further comprises 16 data lines.

15. The re-writable memory of claim 13 wherein the two-terminal memory plugs are arranged in a single layer.

16. A re-writable memory, comprising:
a substrate;
a cross point memory array formed above the substrate, including
  a first conductive array line;
  second conductive array lines, each of the second conductive array lines oriented generally substantially perpendicular to the first conductive array line;
  two-terminal memory plugs, each memory plug having a first terminal in electrical communication with the first conductive array line and a second terminal in electrical communication with one of the second conductive array lines, each memory plug configured to store an element of an information set; and
a plurality of sensing circuits each configured in electrical communication with an associated one of the second conductive array lines and the memory plugs, so as to substantially simultaneously sense the elements of the information set; and
logic circuits in electrical communication with the plurality of sensing circuits and with a burst clock, the logic circuits responsive to a burst clock signal from the burst clock so as to initiate the output of the information from the plurality of sensing circuits in burst mode upon receiving the burst clock signal.

17. The re-writable memory of claim 16 and further comprising:
a data bus having a plurality of data lines, each data line in electrical communication with an associated one of the sensing circuits, and each configured to receive the elements of the information set from the associated sensing circuit.

18. The re-writable memory of claim 17 wherein the plurality of data lines further comprises 16 data lines.

19. The re-writable memory of claim 17 wherein the two-terminal memory plugs are arranged in a single layer.

20. A method of reading from a re-writable memory, comprising:
in a cross point memory array having a block of two-terminal memory plugs each in electrical communication with one among a plurality of first conductive array lines and one among a plurality of second conductive array lines, transmitting a first electrical signal through a selected one of said first conductive array lines;
sensing a set of second electrical signals transmitted through said plurality of second conductive array lines, wherein multiple ones of said set of second electrical signals are sensed substantially simultaneously;
translating said set of second electrical signals into information; and
receiving an address signal, and decoding said address signal to determine an order in which to output said information, so as to output said information in page mode.

21. A method of reading from a re-writable memory, comprising:
in a cross point memory array having a block of two-terminal memory plugs each in electrical communication with one among a plurality of first conductive array lines and one among a plurality of second conductive array lines, transmitting a first electrical signal through a selected one of said first conductive array lines;
sensing a set of second electrical signals transmitted through said plurality of second conductive array lines, wherein multiple ones of said set of second electrical signals are sensed substantially simultaneously;
translating said set of second electrical signals into information; and
receiving a burst clock signal, and relaying said information upon receipt of said burst clock signal so as to output said information in burst mode.

22. A re-writable memory, comprising:
a substrate;
a cross point memory array formed above the substrate, including
a first conductive array line;
second conductive array lines, each of the second conductive array lines oriented generally substantially perpendicular to the first conductive array line;
memory plugs, each memory plug having conductive oxide electrodes, a first terminal in electrical communication with the first conductive array line, and a second terminal in electrical communication with one of the second conductive array lines, each memory plug configured to store an element of an information set;
a plurality of sensing circuits each configured in electrical communication with an associated one of the second conductive array lines and the memory plugs, so as to substantially simultaneously sense the elements of the information set; and
decoder circuits in electrical communication with the plurality of sensing circuits, the decoder circuits configured to determine from an address signal an order in which to output the information from ones of the plurality of sensing circuits, so as to output the information in page mode.

23. The re-writable memory of claim 22 and further comprising:
a data bus having a plurality of data lines, each data line in electrical communication with an associated one of the sensing circuits, and each configured to receive the elements of the information set from the associated sensing circuit.

24. The re-writable memory of claim 23 wherein the plurality of data lines further comprises 16 data lines.

25. A re-writable memory, comprising:
a substrate;
a memory array formed above the substrate, including
a first conductive array line;
second conductive array lines;
memory plugs having conductive oxide electrodes, each memory plug having a first terminal in electrical communication with the first conductive array line and a second terminal in electrical communication with one of the second conductive array lines, and each memory plug configured to assume a first electrical resistance that corresponds to a first data state in response to a first voltage and a second electrical resistance that corresponds to a second data state in response to a second voltage; and
sensing circuits, each sensing circuit in electrical communication with one of the second conductive array lines and an associated one of the memory plugs, each sensing circuit further configured to sense an electrical current passing through said one of the second conductive array lines so as to read the first and second data states from the associated one of the memory plugs,
wherein the sensing circuits are configured to sense the first and second data states in either page mode or burst mode,
and wherein the sensing circuits are configured to translate the first and second data states into binary information.

26. The re-writable memory of claim 25 further comprising address circuits configured to identify selective ones of the sensing circuits for output of said binary information in page mode.

27. The re-writable memory of claim 26 further comprising a burst clock configured to trigger said sensing circuits to output said binary information in burst mode.

28. The re-writable memory of claim 26 further comprising address circuits in electrical communication with the driver circuits and configured to receive binary information and an address signal, the address circuits further configured to distribute the binary information to the decoder circuits according to the address signal, so as to facilitate writing of the received binary information to the two-terminal memory plugs in page mode.

29. A re-writable memory, comprising:
a substrate;
a cross point memory array formed above the substrate, including
a first conductive array line;
second conductive array lines, each of the second conductive array lines oriented generally substantially perpendicular to the first conductive array line;
memory plugs, each memory plug having conductive oxide electrodes, a first terminal in electrical communication with the first conductive array line, and a second terminal in electrical communication with one of the second conductive array lines, each memory plug configured to store an element of an information set;
a plurality of sensing circuits each configured in electrical communication with an associated one of the second conductive array lines and the memory plugs, so as to substantially simultaneously sense the elements of the information set; and
logic circuits in electrical communication with the plurality of sensing circuits and with a burst clock, the logic circuits responsive to a burst clock signal from the burst clock so as to initiate the output of the information from the plurality of sensing circuits in burst mode upon receiving the burst clock signal.

30. The re-writable memory of claim 29 and further comprising:
a data bus having a plurality of data lines, each data line in electrical communication with an associated one of the sensing circuits, and each configured to receive the elements of the information set from the associated sensing circuit.

31. The re-writable memory of claim 30 wherein the plurality of data lines further comprises 16 data lines.

* * * * *